United States Patent
Chen et al.

(10) Patent No.: US 12,451,872 B2
(45) Date of Patent: Oct. 21, 2025

(54) MULTI-PHASE CLOCK GENERATION CIRCUIT

(71) Applicant: Huawei Technologies Co., Ltd., Shenzhen (CN)

(72) Inventors: Sheng Chen, Shenzhen (CN); Theng Tee Yeo, Singapore (SG)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 330 days.

(21) Appl. No.: 18/338,893

(22) Filed: Jun. 21, 2023

(65) Prior Publication Data

US 2023/0336163 A1   Oct. 19, 2023

Related U.S. Application Data

(63) Continuation of application No. PCT/CN2020/139332, filed on Dec. 25, 2020.

(51) Int. Cl.
*H03K 3/012* (2006.01)
*H03K 3/037* (2006.01)
*H03K 19/20* (2006.01)

(52) U.S. Cl.
CPC .......... *H03K 3/012* (2013.01); *H03K 3/037* (2013.01); *H03K 19/20* (2013.01)

(58) Field of Classification Search
CPC ......... H03K 3/012; H03K 3/037; H03K 19/20
See application file for complete search history.

(56) References Cited

U.S. PATENT DOCUMENTS

| 3,532,991 A | 10/1970 | Winder | |
|---|---|---|---|
| 7,459,952 B2* | 12/2008 | Ogita | H03K 5/1515 327/239 |
| 2005/0040875 A1* | 2/2005 | Lee | H03K 5/1515 327/291 |
| 2006/0038596 A1* | 2/2006 | Wang | H03L 7/0816 327/158 |
| 2006/0186940 A1* | 8/2006 | Lin | G06F 1/06 327/291 |
| 2010/0253405 A1* | 10/2010 | Quan | H03K 5/1515 327/158 |

(Continued)

OTHER PUBLICATIONS

Kerim Kibaroglu et al, "A 0.05-6 GHZ Voltage-Mode Harmonic Rejection Mixer with up to 30 dBm In-Band IIP3 and 35 dBc HRR in 32 nm SOI CMOS," RTU1A-5, 2017 IEEE Radio Frequency Integrated Circuits Symposium, Jul. 7, 2017, total 4 pages.

(Continued)

*Primary Examiner* — Raymond S Dean
(74) *Attorney, Agent, or Firm* — Conley Rose, P.C.

(57) ABSTRACT

A multi-phase clock generation circuit is configured to generate a multi-phase non-overlapping clock signal and includes a loop structure, where input ends and output ends of a plurality of logic gates are electrically coupled head to tail to form the loop structure; and a plurality of latches configured to latch signals at the input ends of the logic gates. The multi-phase clock generation circuit performs a logical operation based on selection signals and clock signals that are received at the logic gates, latches data of upper-stage logic gates that is received at logic gates in a loop through the latches, and outputs multi-phase non-overlapping clock signals through the output ends of the logic gates.

20 Claims, 16 Drawing Sheets

(56) References Cited

U.S. PATENT DOCUMENTS

2014/0079177 A1 3/2014 Li
2017/0310328 A1* 10/2017 Ishibashi .................. H03L 7/18

OTHER PUBLICATIONS

Bart J. Thijssen et al:"A 370μW 5.5dB-NF BLE/BT5.0/IEEE 802. 15.4-Compliant Receiver with >63dB Adjacent Channel Rejection at >2 Channels Offset in 22nm FDSOI", Apr. 13, 2020, total 5 pages.

* cited by examiner

MULTI-PHASE CLOCK GENERATION CIRCUIT

CROSS-REFERENCE TO RELATED APPLICATIONS

This is a continuation of International Patent Application No. PCT/CN2020/139332 filed on Dec. 25, 2020, the disclosure of which is hereby incorporated by reference in its entirety.

TECHNICAL FIELD

This disclosure relates to circuit technologies, and in particular, to a clock processing circuit.

BACKGROUND

Multi-phase non-overlapping clocks are widely used in fields such as radio frequency signal processing and analog-to-digital (AD) conversion. The multi-phase non-overlapping clocks include multi-phase clock signals, and any two phase clock signals do not overlap each other. For example, for 8-phase non-overlapping clocks, a duty cycle of each phase clock signal is ⅛, and a phase difference between two adjacent phase clock signals is ⅛ of a cycle.

FIG. 1 shows an 8-phase non-overlapping clock generation circuit 100. The 8-phase non-overlapping clock generation circuit 100 includes four delay flip-flops or D flip-flops (DFFs) and eight AND gates. The foregoing four D flip-flops, i.e., DFF1 to DFF4, are connected in series, and respectively receive differential clock signals CKP and CKN, a positive output end Q4 of the D flip-flop DFF4 is connected to an inverting input end $\overline{D}$ of the D flip-flop DFF1, and an inverting output end $\overline{Q4}$ of the D flip-flop DFF4 is connected to a positive input end D of the D flip-flop DFF1. A positive output end Q and an inverting output end $\overline{Q}$ of each DFF of the foregoing four D flip-flops DFF1 to DFF4 are respectively connected to the eight AND gates, to output differential clock signals whose frequencies are divided by four to the eight AND gates at a duty cycle of 50 percent (%), and 8-phase non-overlapping clock signals are generated through the eight AND gates. Phases of the 8-phase non-overlapping clock signals are 0 degrees (°), 45°, 90°, 135°, 180°, 225°, 270°, and 315° respectively, and the duty cycle of each signal is ⅛.

The 8-phase non-overlapping clock generation circuit 100 requires at least four D flip-flops and eight AND gates. A high-speed D flip-flop generally consumes a large current, resulting in high power consumption of the 8-phase non-overlapping clock generation circuit 100. However, from an input end to an output end of the 8-phase non-overlapping clock generation circuit 100, the clock signals pass through at least one D flip-flop and one AND gate, which results in increasing noise and delay of the output 8-phase non-overlapping clock signals.

SUMMARY

An embodiment of this disclosure provides a multi-phase clock generation circuit. Multi-phase non-overlapping clock signals with low delay, low noise, and low power consumption are generated through a loop structure formed by a plurality of logic gates and latches.

According to a first aspect, an embodiment of this disclosure provides a multi-phase clock generation circuit, including a plurality of first logic gates and a plurality of first latches. The first logic gate is configured to implement a basic logical operation, for example, a NOR operation or a NAND operation, and the first latch is configured to latch data. Details are as follows. The plurality of first logic gates are connected in series in a first loop, and each first logic gate includes a first selection signal input end, a clock signal input end, and an output end. The first selection signal input end is configured to receive a selection signal. The clock signal input end is configured to receive a clock signal. The clock signal may be a signal in a differential clock signal, or may be an intermediate signal obtained after the differential signal is processed. An output end of each first logic gate is configured to output one phase clock signal in multi-phase clock signals. Therefore, a quantity of first logic gates is equal to a quantity of phases of the multi-phase clock signals. In the first loop, a first selection signal input end of each first logic gate is electrically connected to an output end of a first logic gate of a previous stage. The foregoing plurality of first latches are also disposed in the first loop, and are respectively configured to latch a signal received at the first selection signal input end of the first logic gate. The multi-phase clock generation circuit performs latching and the logical operation on the clock signal by using the loop structure according to the received clock signal, and finally obtains non-overlapping multi-phase clock signals.

Because the loop structure is used, clock signal processing is implemented through a NOR gate or a NAND gate, and the selection signal is latched by the latch, the multi-phase non-overlapping clock generation circuit provided in this embodiment of this disclosure generates the multi-phase non-overlapping clock signals through lower power consumption, lower delay, and lower noise. Because a D flip-flop is not required in the multi-phase non-overlapping clock generation circuit, the power consumption of the circuit is greatly reduced. In addition, the input clock signal needs to pass through only one logic gate to be output as one phase clock signal in the multi-phase clock signals. For example, for one of the first logic gates, a clock signal input end of the first logic gate receives a clock signal, and an output signal may be obtained after a NOR operation is performed. In the conventional technology, an input clock signal needs to pass through at least one AND gate and one D flip-flop, and the AND gate needs to be connected to one NAND gate and one NOT gate in engineering implementation. Therefore, compared with the conventional technology, the input clock signal passes through a smaller quantity of logic gates, so that the noise of the signal is lower and the delay is lower, so that the multi-phase non-overlapping clock generation circuit may be used in signal processing at a higher frequency.

In a possible implementation, each first logic gate is a first NOR gate, that is, the first logic gate performs a NOR operation on a received signal and outputs the signal. Each first latch is further configured to latch signals received at first selection signal input ends of two first logic gates in the first logic gates. Each first latch includes two two-input second NOR gates symmetrically disposed in the first loop. Each second NOR gate includes a first input end, a second input end, and an output end. For the two second NOR gates in each first latch, a second input end of each second NOR gate is electrically connected to an output end of the other second NOR gate, and output ends of the two second NOR gates are further correspondingly electrically connected to first selection signal input ends of the two first logic gates. The selection signal may be latched by using an overlapped latch structure. The received clock signal can be output as one phase clock signal in the multi-phase clock signals by passing through at least only one latch and one logic gate, which greatly reduces delay and further reduces power consumption compared with the conventional technology.

In a possible implementation, the foregoing first NOR gate is a three-input NOR gate, and the foregoing input clock signal is a differential clock signal, namely, two clock signals with a phase difference of 180°. Each first logic gate (namely, the three-input NOR gate) further includes a second selection signal input end, and the second selection signal input end is electrically connected to a first selection signal input end of a first logic gate of a previous N−2 stage. In the first loop, clock signal input ends of first logic gates of every two adjacent stages are respectively configured to correspondingly receive the differential clock signal. N first logic gates are spaced between the two second NOR gates in each first latch, that is, for two second NOR gates in a same first latch, N first logic gates are spaced between an output end of one second NOR gate and a first input end of the other second NOR gate. A quantity of the foregoing first logic gates is 2N, and a quantity of the first latches is N. Therefore, the generated multi-phase clock signals are 2N-phase clock signals. N is an integer greater than or equal to 3. A proper selection signal and a clock signal are allocated to each first logic gate. Through a NOR operation and latching processing, the multi-phase clock generation circuit may shield a clock signal corresponding to an unnecessary phase in the clock, and generate only a clock signal corresponding to a required phase, thereby generating 2N-phase non-overlapping clock signals with a duty cycle of ½N.

In a possible implementation, an embodiment of this disclosure provides a specific 4-phase clock signal generation circuit, that is, the foregoing N=2. The foregoing first NOR gate is a two-input NOR gate. In the first loop, clock signal input ends of first logic gates of every two adjacent stages are respectively configured to correspondingly receive input clock signals, namely, two clocks signals with a phase difference of 180° in the differential clock signal. Because 4-phase non-overlapping clock signals are generated, two first logic gates are spaced between two second NOR gates in each first latch, a quantity of first logic gates is 4, and a quantity of first latches is 2. For the 4-phase clock generation circuit, the first logic gate may be achieved with only two input NOR gates, which reduces complexity of a circuit design.

In a possible implementation, the foregoing first NOR gate is a two-input NOR gate, N first logic gates are spaced between two second NOR gates in the first latch, a total quantity of first logic gates is 2N, and a quantity of first latches is N. Different from the foregoing embodiment, the input clock signal received at the first logic gate is generated by another loop (a second loop) in the multi-phase clock generation circuit. In addition to the first loop, the multi-phase clock generation circuit further includes the second loop. The second loop is configured to receive the differential clock signal, generate an intermediate clock signal by performing logic processing on the differential clock signal, and output the intermediate clock signal as the input clock signal to the first logic gate in the first loop. Details are as follows. The multi-phase clock generation circuit further includes N second logic gates connected in series in the second loop, each second logic gate includes a selection signal input end, a clock signal input end, and an output end. In addition, a selection signal input end of each second logic gate is electrically connected to an output end of a second logic gate of a previous stage. The second logic gate may be a NOR gate, or may be a NAND gate. The clock signal input end of each second logic gate is configured to receive one clock signal in the differential clock signal, and the output end of each second logic gate is configured to output one of N intermediate clock signals, and output the one intermediate clock signal to two first logic gates in clock signal input ends of the 2N first logic gates. A specific correspondence rule may be that two first logic gates between which N−1 first logic gates are spaced receive an intermediate clock signal output at an output end of a same second logic gate. For example, a first second logic gate in the second loop is configured to generate an intermediate clock signal, and output the intermediate clock signal to a first first logic gate and a (N+1)th first logic gate in the first loop. N−1 first logic gates are spaced between the first first logic gate and the (N+1)th first logic gate, and other cases are deduced by analogy. In addition to the second logic gate, the second loop further includes N/2 second latches, respectively configured to latch a signal received at a selection signal input end of at least one second logic gate in the N second logic gates. The multi-phase non-overlapping clock signal generation circuit is achieved through the two loops, and a D flip-flop with high delay and high power consumption is not needed, so that an objective of reducing the delay and power consumption is implemented.

In a possible implementation, the foregoing second logic gates are all two-input first NAND gates. Each second latch includes two two-input second NAND gates symmetrically disposed in the second loop. The second NAND gate includes a first input end, a second input end, and an output end. For two second NAND gates in each second latch, N/2 second logic gates are spaced between the two. A second input end of each second NAND gate is electrically connected to an output end of the other second NAND gate, and output ends of the two second NAND gates are further correspondingly electrically connected to selection signal input ends of two second logic gates. Clock signal input ends of second logic gates of every two adjacent stages are respectively configured to correspondingly receive two clock signals with a phase difference of 180° in the differential clock signal. A proper selection signal and a clock signal are allocated to each first logic gate. Through a NOR operation and latching processing, the multi-phase clock generation circuit may shield a clock signal corresponding to an unnecessary phase in the clock, and generate only a clock signal corresponding to a required phase, thereby generating 2N-phase non-overlapping clock signals with a duty cycle of ½N.

In a possible implementation, in the foregoing implementation, the first logic gate may be replaced with a third NAND gate, and the first latch may also be replaced with a fourth NAND gate. To ensure that non-overlapping clock signals are output, a first phase inverter further needs to be added to an output end of each first logic gate. Therefore, each first logic gate in the first loop is the third NAND gate, that is, the first logic gate performs a NOR operation on a received signal and outputs the signal. Each first latch is further configured to latch signals received at first selection signal input ends of two first logic gates in the first logic gates. Each first latch includes two two-input fourth NAND gates symmetrically disposed in the first loop. Each fourth NAND gate includes a first input end, a second input end, and an output end. For two fourth NAND gates in each first latch, a second input end of each fourth NAND gate is electrically connected to an output end of the other fourth NAND gate, and output ends of the two fourth NAND gates are further correspondingly electrically connected to the first selection signal input ends of the two first logic gates. The selection signal may be latched by using an overlapped latch structure. The received clock signal can be output as one phase clock signal in the multi-phase clock signals by passing through at least only one latch and one logic gate, which greatly reduces delay and further reduces power consumption compared with the conventional technology. This embodiment provides another feasible solution. The NOR gates in the first loop are all replaced with NAND gates, and multi-phase non-overlapping clocks are also generated.

In a possible implementation, the foregoing third NAND gate is a three-input NOR gate, and the foregoing input clock signal is a differential clock signal, namely, two clock signals with a phase difference of 180°. Each first logic gate (namely, the three-input NAND gate) further includes a second selection signal input end, and the second selection signal input end is electrically connected to a first selection signal input end of a first logic gate of a previous N−2 stage. In the first loop, clock signal input ends of first logic gates of every two adjacent stages are respectively configured to correspondingly receive the differential clock signal. N first logic gates are spaced between two fourth NAND gates in each first latch, that is, for two fourth NAND gates in a same first latch, N first logic gates are spaced between an output end of one fourth NAND gate and a first input end of the other fourth NAND gate. A quantity of the foregoing first logic gates is 2N, and a quantity of the first latches is N. Therefore, the generated multi-phase clock signals are 2N-phase clock signals. N is an integer greater than or equal to 3. A proper selection signal and a clock signal are allocated to each first logic gate. Through a NOR operation and latching processing, the multi-phase clock generation circuit may shield a clock signal corresponding to an unnecessary phase in the clock, and generate only a clock signal corresponding to a required phase, thereby generating 2N-phase non-overlapping clock signals with a duty cycle of ½N.

In a possible implementation, an embodiment of this disclosure provides a specific 4-phase clock signal generation circuit, that is, the foregoing N=2. The foregoing third NAND gate is a two-input NAND gate. In the first loop, clock signal input ends of first logic gates of every two adjacent stages are respectively configured to correspondingly receive input clock signals, namely, two clocks with a phase difference of 180° in the differential clock signal. Because 4-phase non-overlapping clock signals are generated, two first logic gates are spaced between two third NAND gates in each first latch, a quantity of first logic gates is 4, and a quantity of first latches is 2. For the 4-phase clock generation circuit, the first logic gate may be achieved with only two input NOR gates, which reduces complexity of a circuit design.

In a possible implementation, the foregoing third NAND gate is a two-input NOR gate, N first logic gates are spaced between two fourth NAND gates in the first latch, a total quantity of first logic gates is 2N, and a quantity of first latches is N. Different from the foregoing embodiment, the input clock signal received at the first logic gate is generated by another loop (a second loop) in the multi-phase clock generation circuit. Therefore, in addition to the first loop, the multi-phase clock generation circuit further includes the second loop. The second loop is configured to receive the differential clock signal, generate an intermediate clock signal by performing logic processing on the differential clock signal, and output the intermediate clock signal as the input clock signal to the first logic gate in the first loop. Details are as follows. The multi-phase clock generation circuit further includes N second logic gates connected in series in the second loop, each second logic gate includes a selection signal input end, a clock signal input end, and an output end. In addition, a selection signal input end of each second logic gate is electrically connected to an output end of a second logic gate of a previous stage. The second logic gate may be a NOR gate, or may be a NAND gate. The clock signal input end of each second logic gate is configured to receive one clock signal in the differential clock signal, and the output end of each second logic gate is configured to output one of N intermediate clock signals, and output the one intermediate clock signal to two first logic gates in clock signal input ends of the 2N first logic gates. A specific correspondence rule may be that two first logic gates between which N−1 first logic gates are spaced receive an intermediate clock signal output at an output end of a same second logic gate. For example, a first second logic gate in the second loop is configured to generate an intermediate clock signal, and output the intermediate clock signal to a first first logic gate and a $(N+1)^{th}$ first logic gate in the first loop. N−1 first logic gates are spaced between the first first logic gate and the (N+1)th first logic gate, and other cases are deduced by analogy. In addition to the second logic gate, the second loop further includes N/2 second latches, respectively configured to latch a signal received at a selection signal input end of at least one second logic gate in the N second logic gates. The multi-phase non-overlapping clock signal generation circuit is achieved through the two loops, and a D flip-flop with high delay and high power consumption is not needed, so that an objective of reducing the delay and power consumption is implemented.

In a possible implementation, the foregoing second logic gates are all two-input fifth NOR gates. Each second latch is configured to latch signals received at selection signal input ends of two second logic gates in the at least one second logic gate. Each second latch includes two two-input sixth NOR gates symmetrically disposed in the second loop. The sixth NOR gate includes a first input end, a second input end, and an output end. For two sixth NOR gates in each second latch, N/2 second logic gates are spaced between the two sixth NOR gates. A second input end of each sixth NOR gate is electrically connected to an output end of the other sixth NOR gate, and output ends of the two sixth NOR gates are further correspondingly electrically connected to selection signal input ends of the two second logic gates. Clock signal input ends of second logic gates of every two adjacent stages are respectively configured to correspondingly receive two clock signals with a phase difference of 180° in the differential clock signal. A proper selection signal and a clock signal are allocated to each first logic gate. Through a NOR operation and latching processing, the multi-phase clock generation circuit may shield a clock signal corresponding to an unnecessary phase in the clock, and generate only a clock signal corresponding to a required phase, thereby generating 2N-phase non-overlapping clock signals with a duty cycle of ½N.

According to a second aspect, an embodiment of this disclosure provides a radio frequency signal processing circuit, including a local oscillator and a frequency mixer. An output end of the local oscillator is electrically connected to an input end of the frequency mixer. The local oscillator is configured to generate an initial signal and output the signal to the frequency mixer. The frequency mixer is configured to perform frequency mixing on signals. The frequency mixer may include the multi-phase clock generation circuit in any possible implementation of the first aspect. The foregoing radio frequency signal processing circuit may be disposed in a radio frequency front-end chip.

According to a third aspect, an embodiment of this disclosure provides a wireless communication device. The wireless communication device may be an operator communication device, such as a smartphone, a tablet computer, an intelligent wearable device, or a base station. The wireless communication device includes a radio frequency signal processing circuit and an antenna. The antenna is connected to the radio frequency signal processing circuit, the radio frequency signal processing circuit is configured to process a signal received by the antenna, and the radio frequency signal processing circuit may be the radio frequency signal processing circuit according to the second aspect.

DESCRIPTION OF EMBODIMENTS

The following describes the technical solutions in embodiments of this disclosure with reference to the accompanying drawings.

In this disclosure, terms "first", "second", and the like are merely for a purpose of description, and shall not be construed as indicating or implying relative importance or implicitly indicating a quantity of indicated technical features. In addition, the term "electrical connection" shall be construed in a broad sense. For example, the "electrical connection" may mean a direct connection in physics, or may mean a connection implemented in electronics through an intermediate medium, for example, a connection implemented through a resistor, an inductor, or another electrical element.

An embodiment of this disclosure provides a low-power, low-delay, and low-noise multi-phase clock generation circuit. The multi-phase clock generation circuit may be configured to process a radio frequency signal, for example, may be used in a frequency mixer in a radio frequency receiver, or may be used in the field of a switched capacitor filter (SCF), a multi-phase time interleaving analog-to-digital converter (ADC), or the like. The multi-phase clock generation circuit is configured to generate multi-phase non-overlapping clock signals. For N-phase non-overlapping clock signals, a duty cycle of each phase clock signal is 1/N, and a phase difference between two adjacent phase clock signals is 1/N of a cycle. Therefore, at any moment, in the N-phase non-overlapping clock signals, only one phase clock signal has an effective level, and other phase clock signals all have invalid levels and do not overlap the one phase clock signal.

Figure 1:
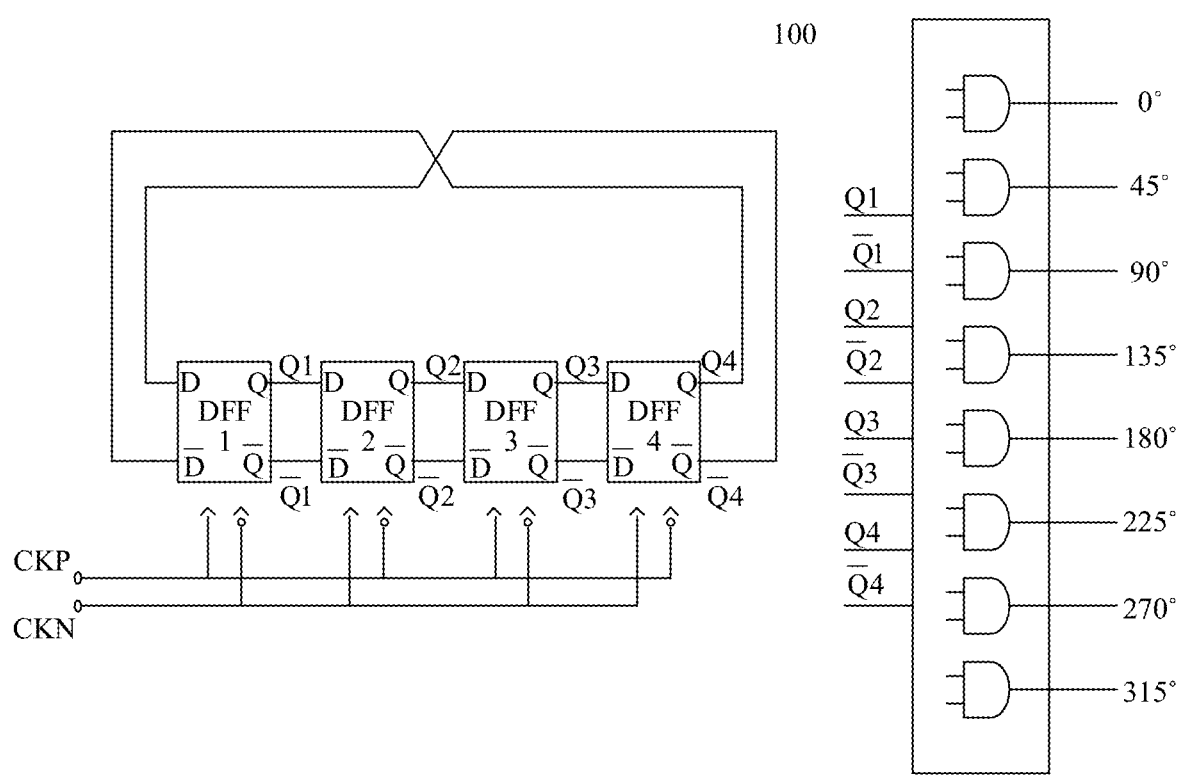
FIG. 1 is an 8-phase non-overlapping clock generation circuit.
Figure 2:
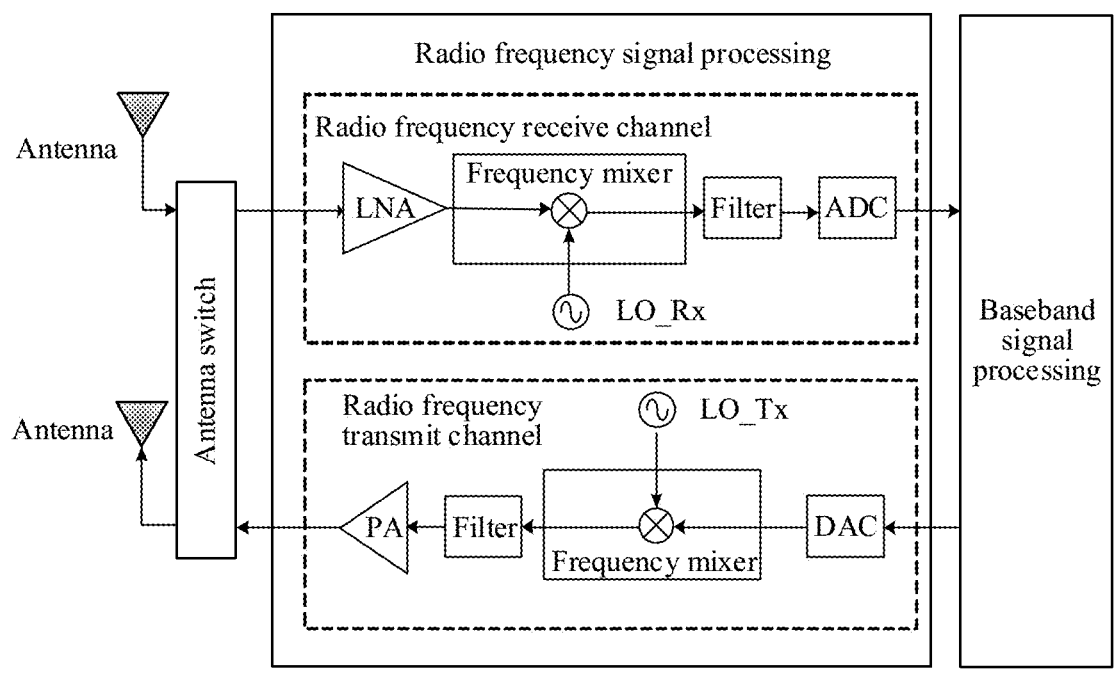
FIG. 2 is a schematic diagram of a circuit structure of a wireless communication device according to an embodiment.

Radio frequency signal processing is used as an example. An embodiment of this disclosure provides a schematic diagram of a circuit structure of a wireless communication device 200 as shown in FIG. 2. The wireless communication device 200 may be a device that has a wireless communication function, such as a mobile phone or a base station. FIG. 2 shows some common components for radio frequency signal processing in the wireless communication device 200.

The wireless communication device 200 includes a baseband signal processing circuit, a radio frequency signal processing circuit, an antenna switch, and antennas. The radio frequency signal processing circuit includes a radio frequency receive channel and a radio frequency transmit channel. It should be understood that although FIG. 2 shows only one radio frequency receive channel and one radio frequency transmit channel, the wireless communication device 200 in this embodiment of this disclosure is not limited thereto. The wireless communication device 200 may include one or more radio frequency receive channels and one or more radio frequency transmit channels.

For the radio frequency receive channel, a radio frequency signal received from the antenna is sent to the radio frequency receive channel after being selected by the antenna switch. Because the radio frequency signal received from the antenna is generally very weak, the radio frequency signal is generally amplified by using a low noise amplifier (LNA). An amplified signal is first down-converted by a frequency mixer, and then passes through a filter and an ADC. Finally, baseband signal processing is completed. For the radio frequency transmit channel, a baseband signal is converted into an analog signal by using a digital-to-analog converter (DAC), and the analog signal is converted into a radio frequency signal by being up-converted by a frequency mixer. Processed by a filter and a power amplifier (PA), the radio frequency signal is finally radiated from a selected antenna through selection of the antenna switch.

In the frequency mixer, an input signal is mixed with a signal generated by a local oscillator (LO), so that the input signal can be up-converted (corresponding to the radio frequency transmit channel) or down-converted (corresponding to the radio frequency receive channel). The foregoing local oscillator LO includes a receive channel local oscillator (LO_Rx) and a transmit channel local oscillator (LO_Tx) as shown in FIG. 2. The local oscillator LO is a common term in the radio frequency field, and is generally referred to as a LO. A main function of the LO is to provide a specific frequency, for example, a carrier frequency, required for radio frequency signal processing. A higher frequency may be achieved by using a component such as a phase locked loop (PLL) or a delay locked loop (DLL), and a lower frequency may be directly achieved by using a crystal oscillator, or may be achieved by performing frequency division on high-frequency signals generated by the component such as the PLL.

Figure 3:
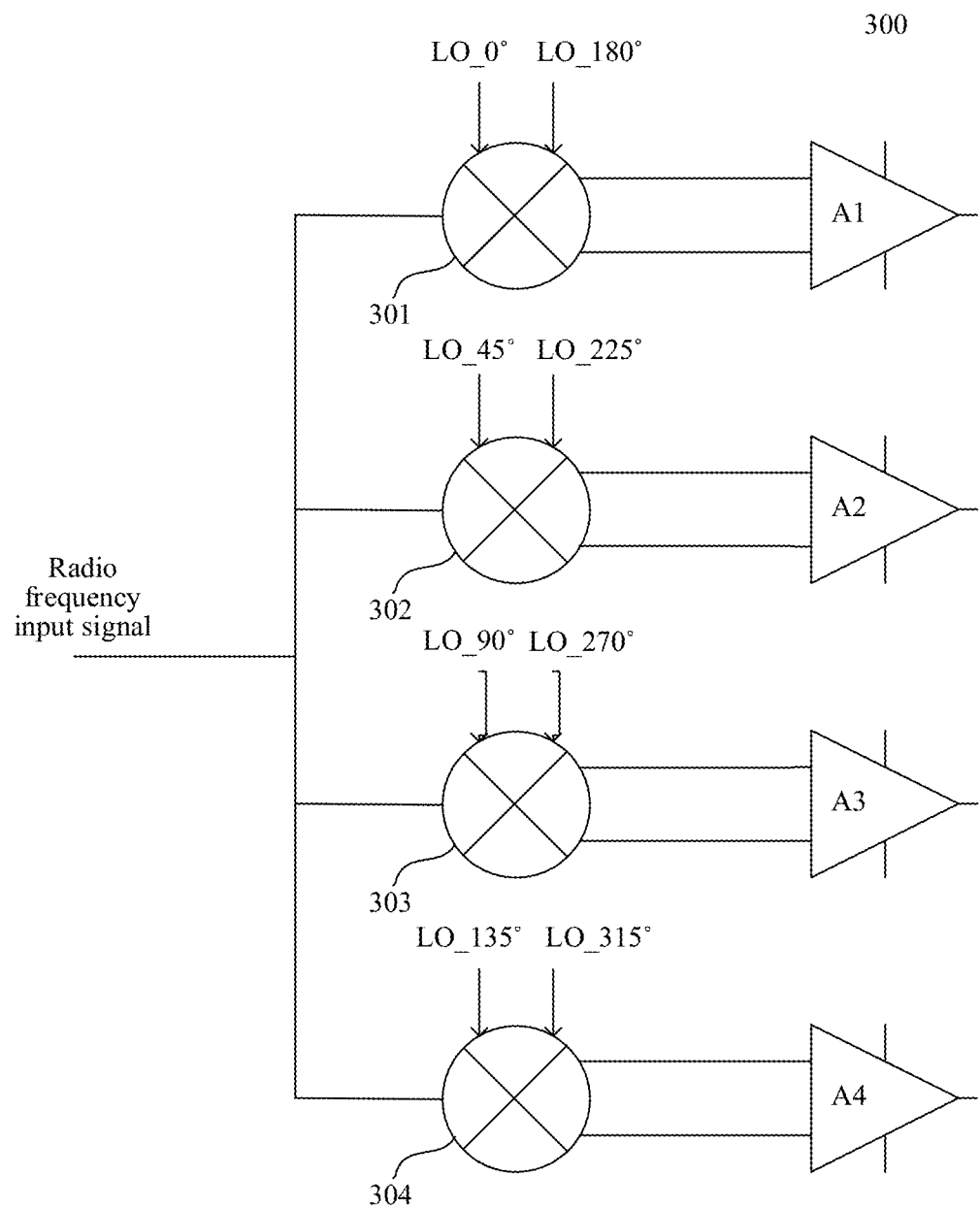
FIG. 3 is a schematic diagram of a circuit structure of a harmonic rejection mixer according to an embodiment.

The frequency mixer in the radio frequency receive channel is used as an example. FIG. 3 is a schematic diagram of a circuit structure of a harmonic rejection mixer (HRM) 300 according to an embodiment of this disclosure. The HRM 300 receives an amplified radio frequency input signal generated by an LNA of a previous stage in the radio frequency receive channel, and receives multi-phase non-overlapping clock signals LO_0°, LO_45°, LO_90°, LO_135°, LO_180°, LO_225°, LO_270°, and LO_315° that are generated by the receive channel local oscillator LO_Rx. The HRM 300 includes four frequency mixers connected in parallel, and four differential amplifiers connected to output ends of the four frequency mixers respectively. A frequency mixer 301 receives the radio frequency input signal, the LO_0°, and the LO_180°, performs frequency mixing processing on the radio frequency input signal based on the two clock signals LO_0° and LO_180° respectively, and inputs two mixed signals respectively to an amplifier A1 for amplification. Similarly, a frequency mixer 302 receives the radio frequency input signal, the LO_45°, and the LO_225°, performs frequency mixing processing on the radio frequency input signal based on the two clock signals LO_45° and LO_225° respectively, and inputs mixed signals respectively to an amplifier A2 for amplification. A frequency mixer 303 receives the radio frequency input signal, the LO_90°, and the LO_270°, performs frequency mixing processing on the radio frequency input signal based on the two clock signals LO_90° and LO_270° respectively, and inputs mixed signals respectively to an amplifier A3 for amplification. A frequency mixer 304 receives the radio frequency input signal, the LO_135°, and the LO_315°, performs frequency mixing processing on the radio frequency input signal based on the two clock signals LO_135° and LO_315° respectively, and inputs mixed signals respectively to an amplifier A4 for amplification.

The HRM 300 rejects $3^{rd}$ and $5^{th}$ harmonic interference through 8-phase non-overlapping clocks generated by the local oscillator LO. Because the foregoing HRM 300 uses the 8-phase non-overlapping clocks to implement frequency mixing of the radio frequency input signal, which is equivalent to sampling 8 times a frequency of the local oscillator LO, an image closest to the radio frequency input signal appears in $7^{th}$ harmonic and $9^{th}$ harmonic of the local oscillator LO. If there is no mismatch in the circuit, the $3^{rd}$ and $5^{th}$ harmonic interference may be totally eliminated.

Figure 4:
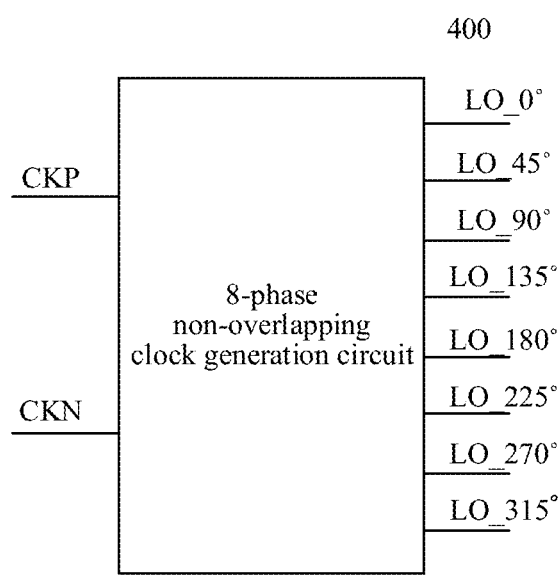
FIG. 4 is an 8-phase non-overlapping clock generation circuit according to an embodiment.

The local oscillator LO may be achieved through an 8-phase non-overlapping clock generation circuit. FIG. 4 shows an 8-phase non-overlapping clock generation circuit 400 according to an embodiment of this disclosure. The 8-phase non-overlapping clock generation circuit 400 includes differential signal input ends for receiving differential signals CKP and CKN, and eight clock signal output ends. The clock signal output ends respectively generate eight clock signals: LO_0°, LO_45°, LO_90°, LO_135°, LO_180°, LO_225°, LO_270° and LO_315°. Frequencies of the differential clock signals CKP and CKN are the same, and a phase difference is 180°. In an implementation, 8-phase non-overlapping clock signals generated by the 8-phase non-overlapping clock generation circuit 400 are input to the HRM 300 as shown in FIG. 3, and are for performing frequency mixing processing on a radio frequency input signal.

Figure 5:
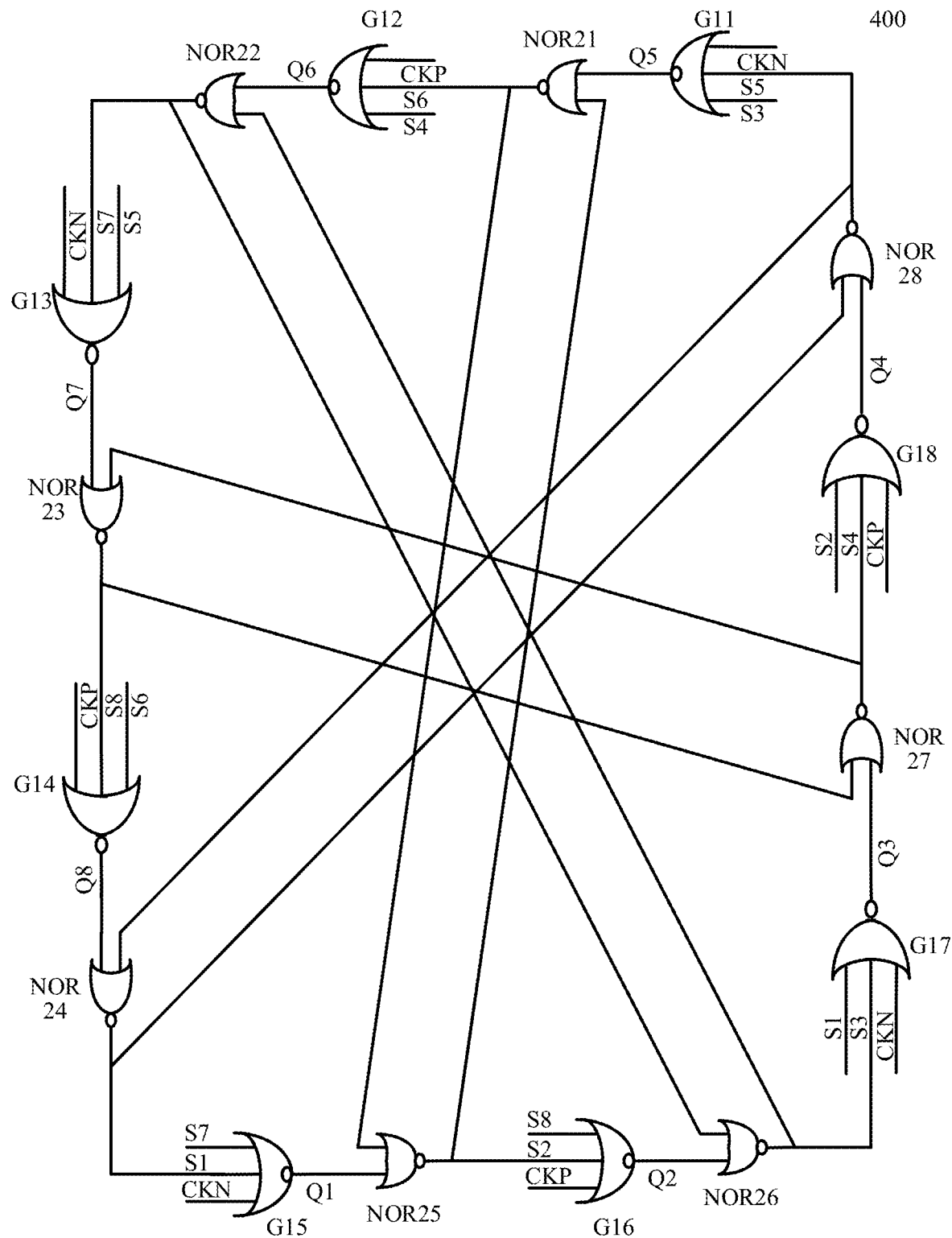
FIG. 5 is a specific 8-phase non-overlapping clock generation circuit according to an embodiment.

FIG. 5 shows a specific 8-phase non-overlapping clock generation circuit 400 according to an embodiment of this disclosure. The foregoing 8-phase non-overlapping clock generation circuit 400 includes eight first logic gates and four first latches.

The eight first logic gates are respectively G11, G12, G13, G14, G15, G16, G17, and G18 as shown in FIG. 5. Each first logic gate includes a first selection signal input end, a second selection signal input end, a clock signal input end, and an output end. First selection signal input ends and output ends of the foregoing eight first logic gates are connected in series in a head-to-tail electrical connection manner to form a loop. Clock signal input ends of the foregoing eight first logic gates are configured to receive an input clock signal CKP or CKN, and the output ends are configured to respectively output 8-phase non-overlapping clock signals. The foregoing 8-phase non-overlapping clock generation circuit 400 further includes the four first latches, and the foregoing first latches are configured to latch signals received at the first selection signal input ends of the first logic gates. A second selection signal input end of the foregoing first logic gate is electrically connected to first selection signal input ends of first logic gates of previous two stages, and clock signal input ends of first logic gates of two adjacent stages are respectively configured to receive differential clock signals CKP and CKN. The first logic gate may further be a NOR gate or a NAND gate. The first logic gate of the 8-phase non-overlapping clock generation circuit 400 shown in FIG. 5 is described by using the NOR gate as an example.

The first latch includes two second NOR gates symmetrically disposed in the loop. Therefore, eight second NOR gates in the foregoing four first latches include NOR21, NOR22, NOR23, NOR24, NOR25, NOR26, NOR27, and NOR28 respectively. The second NOR gate is a two-input NOR gate, and includes a first input end, a second input end, and an output end. For two second NOR gates in each first latch, a second input end of one second NOR gate is electrically connected to an output end of the other second NOR gate. Therefore, input and output of the two second NOR gates NOR2 are symmetrically connected to form a structure of the latch. The two second NOR gates are configured to latch signals received at the first selection signal input ends of the two first logic gates electrically connected to output ends of the foregoing two second NOR gates.

For example, for the first logic gate G11, a first selection signal input end thereof receives a selection signal S5, a second selection signal input end thereof receives a selection signal S3, and a clock signal input end thereof receives a clock signal CKN. The first logic gate G11 performs a NOR logical operation on the selection signal S5, the selection signal S3, and the clock signal CKN, and outputs a result Q5 obtained after the operation is performed to the second NOR gate NOR21 in the first latch. The result Q5 output at the first logic gate G11 is one phase clock signal in the 8-phase non-overlapping clock signals. The selection signal S5 received at the first selection signal input end of the first logic gate G11 is a signal generated at an output end of the second NOR gate NOR28, and the selection signal S3 received at the second selection signal input end is a selection signal input to a first selection signal input end of the first logic gate G17 which is at previous two stages of the first logic gate G11.

Similarly, for the first logic gate G12 at a next stage of the first logic gate G11, the first logic gate G12 performs a NOR logical operation on a selection signal S6, a selection signal S4, and a clock signal CKP, and outputs a result Q6 obtained after the NOR operation is performed to the second NOR gate NOR22. The selection signal S6 received at the foregoing first selection signal input end is a signal generated at an output end of the second NOR gate NOR21, and the selection signal S4 received at the second selection signal input end is a selection signal input to a first selection signal input end of the first logic gate G18, which is at previous two stages of the first logic gate G12.

The two second NOR gates symmetrically disposed in the loop can implement a function of the latch. For example, the second NOR gates NOR21 and NOR25 are symmetrically disposed in the loop, where an output end of the second NOR gate NOR21 is connected to a second input end of the second NOR gate NOR25, and an output end of the second NOR gate NOR25 is connected to a second input end of the second NOR gate NOR21. Therefore, the second NOR gate NOR21 and the second NOR gate NOR25 may implement the function of the latch by latching the selection signal S6 and a selection signal S2. In addition, the second NOR gates NOR22 and NOR26, the second NOR gates NOR23 and NOR27, and the second NOR gates NOR24 and NOR28, respectively, implement the function of the latch as well.

It is clear that, alternatively, the first latch may be achieved through two NAND gates. The first latch of the 8-phase non-overlapping clock generation circuit 400 shown in FIG. 5 is described by using the NOR gate as an example.

In FIG. 5, because a loop structure is used, clock signal processing is implemented through the NOR logical operation or a NAND logical operation, and the selection signal is latched by the latch, so that the 8-phase non-overlapping clock generation circuit 400 generates the 8-phase non-overlapping clock signals with lower power consumption, lower delay and lower noise.

In a circuit design, because a D flip-flop consumes a large amount of current, power consumption of a whole circuit is increased. Because the D flip-flop is not required in the 8-phase non-overlapping clock generation circuit 400, power consumption of the circuit is greatly reduced. In addition, the input clock signal needs to pass through only one logic gate to be output as one phase signal in the multi-phase non-overlapping clock signals. For example, for the first logic gate G11, the clock signal input end thereof receives the clock signal CKN, and generates an output signal Q5 obtained after the NOR operation is performed. However, in the conventional technology, an input clock signal needs to pass through at least one AND gate and one D flip-flop, and the AND gate needs to be connected in series to one NAND gate and one NOT gate in engineering implementation. Therefore, compared with the conventional technology, the input clock signal passes through a smaller quantity of logic gates, so that the noise of an output signal is lower and the delay is lower, so that the 8-phase non-overlapping clock generation circuit 400 may be used in signal processing at a higher frequency.

Figure 6:
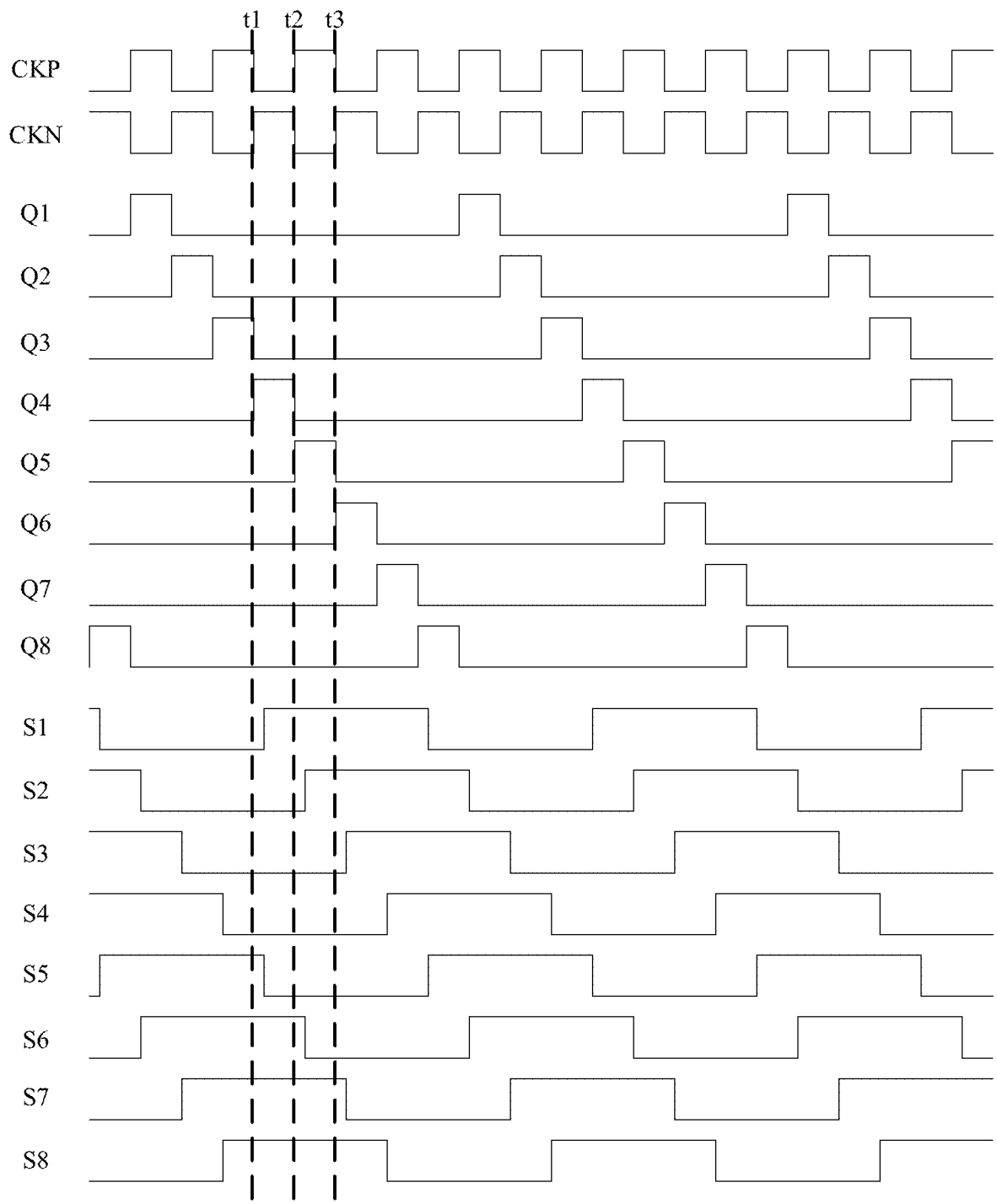
FIG. 6 is a waveform diagram of each port signal in the 8-phase non-overlapping clock generation circuit.

An operation principle of the 8-phase non-overlapping clock generation circuit 400 is described with reference to FIG. 5 and FIG. 6. FIG. 6 is a waveform diagram of each port signal in the 8-phase non-overlapping clock generation circuit 400, including waveform diagrams of differential clock signals CKN and CKP, and waveform diagrams of output port signals Q1 to Q8 of the first logic gates, and waveform diagrams of signals S1 to S8 at first selection signal input ends or second selection signal input ends of the first logic gates. Clock signal input ends of first logic gates of two adjacent stages are configured to receive the differential clock signals CKP and CKN. For example, first logic gates G11 and G12 of two adjacent stages respectively receive the clock signal CKN and the clock signal CKP, and the other first logic gate G18 adjacent to the first logic gate G11 is configured to receive the clock signal CKP. Excited by the differential clock signals CKP and CKN, the first logic gate performs the NOR operation based on an initial state of the clock signal CKN or CKP and an initial state of a first selection signal, and generates the 8-phase non-overlapping clock signals Q1 to Q8 respectively. A duty cycle of each of the 8-phase non-overlapping clock signals Q1 to Q8 is ⅛, and a phase difference between each phase clock signal and a clock signal of an adjacent phase is ⅛ of a cycle.

For example, for the first logic gate G11, at a moment t1, the clock signal CKN received at the first logic gate G11 jumps from a low level to a high level, the selection signal S5 is at the high level, and the selection signal S3 is at the low level. Therefore, after the NOR operation is performed, the generated output signal Q5 is at the low level. At a moment t2, the clock signal CKN received at the first logic gate G11 jumps from the high level to the low level, and the selection signal S5 and the selection signal S3 are both at the low level. Therefore, after the NOR operation is performed, the generated output signal Q5 jumps from the low level to the high level at the moment t2.

For the other seven first logic gates, at the moment t2, at least one signal of the clock signals or the selection signals input at the other seven first logic gates is at the high level. Therefore, an output signal obtained after the NOR operation is performed is at the low level. From the moment t2 to a moment t3, the output signals Q1 to Q4 and Q6 to Q8 of the seven first logic gates are all at the low level, and do not overlap the output signal Q5 generated at the first logic gate G11.

By changing a quantity of first logic gates, a quantity of second NOR gates, and a connection relationship between the first logic gate and the second NOR gate in the 8-phase non-overlapping clock generation circuit 400, another multi-phase non-overlapping clock generation circuit, for example, an even number-phase non-overlapping clock signal, such as 4-phase, 6-phase, 10-phase, or 12-phase non-overlapping clock generation circuit, may be achieved, where the even number is greater than or equal to 4.

Figure 7:
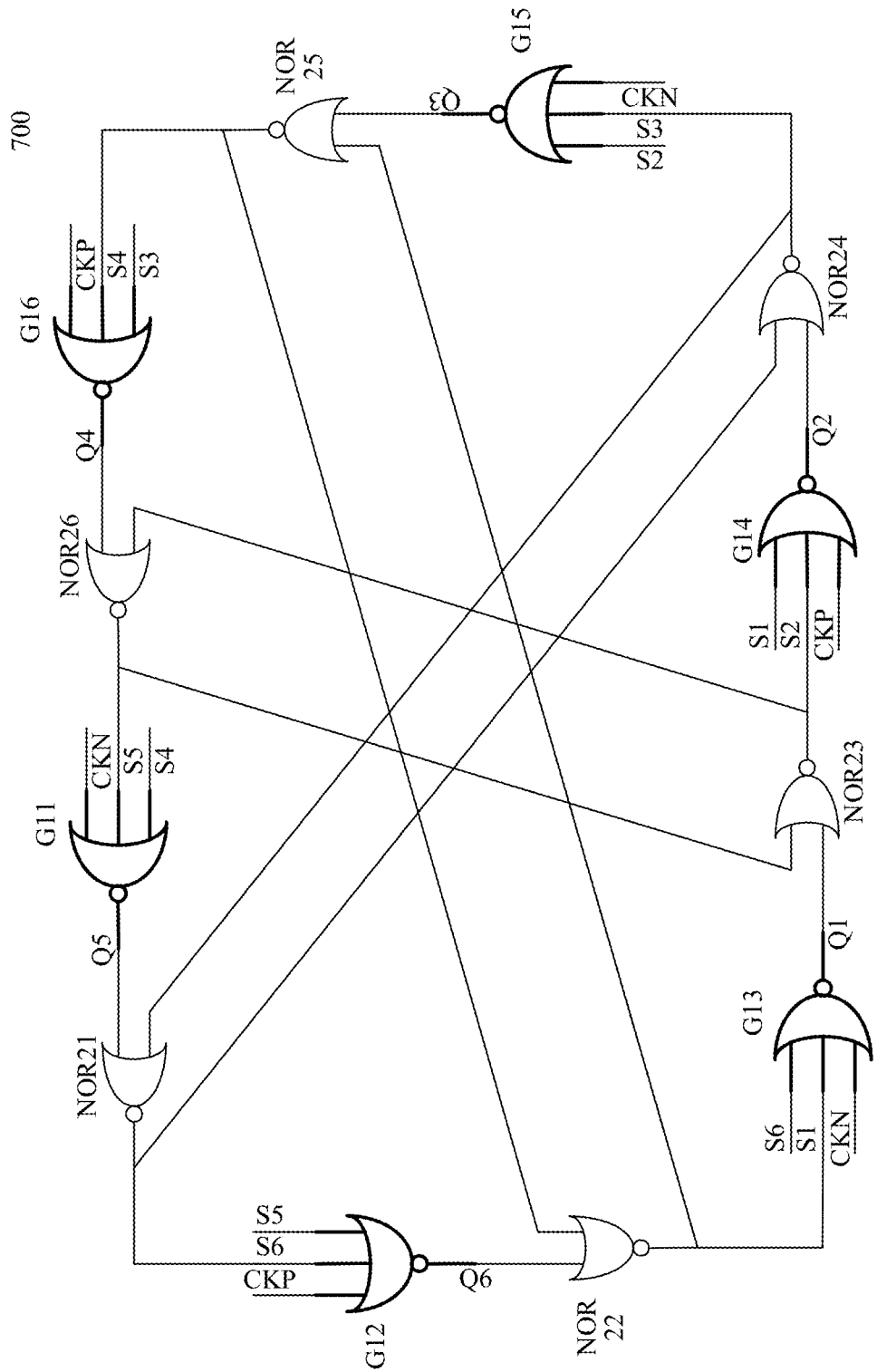
FIG. 7 is a 6-phase non-overlapping clock generation circuit according to an embodiment.

FIG. 7 is a schematic diagram of a 6-phase non-overlapping clock generation circuit 700. Similar to the 8-phase non-overlapping clock generation circuit 400, the foregoing 6-phase non-overlapping clock generation circuit 700 includes six first logic gates and three first latches. As shown in FIG. 7, the six first logic gates are respectively G11, G12, G13, G14, G15, and G16.

In the 6-phase non-overlapping clock generation circuit 700, a clock signal input end of the first logic gate is configured to receive an input clock signal CKP or CKN, and an output end is configured to output 6-phase non-overlapping clock signals. Each first latch includes two second NOR gates NOR2 symmetrically disposed in a loop. Six second NOR gates in the foregoing three first latches include NOR21, NOR22, NOR23, NOR24, NOR25, and NOR26.

For example, for the first logic gate G11, a first selection signal input end thereof receives a selection signal S5, a second selection signal input end thereof receives a selection signal S4, and a clock signal input end thereof receives a clock signal CKN. The first logic gate G11 performs a NOR logical operation on the selection signal S5, the selection signal S4, and the clock signal CKN, and outputs a result Q5 obtained after the operation is performed to the second NOR gate NOR21. The foregoing selection signal S5 received at the first selection signal input end is a signal generated at an output end of the second NOR gate NOR26, and the selection signal S4 received at the second selection signal input end is a selection signal input to a first selection signal input end of the first logic gate G16, a previous stage of the first logic gate G11.

The first logic gate and the first latch in the 6-phase non-overlapping clock generation circuit 700 in FIG. 7 have the same structures, functions, and connection manners as the first logic gate and the first latch in the 8-phase non-overlapping clock generation circuit 400. Details are not described herein again.

Figure 8:
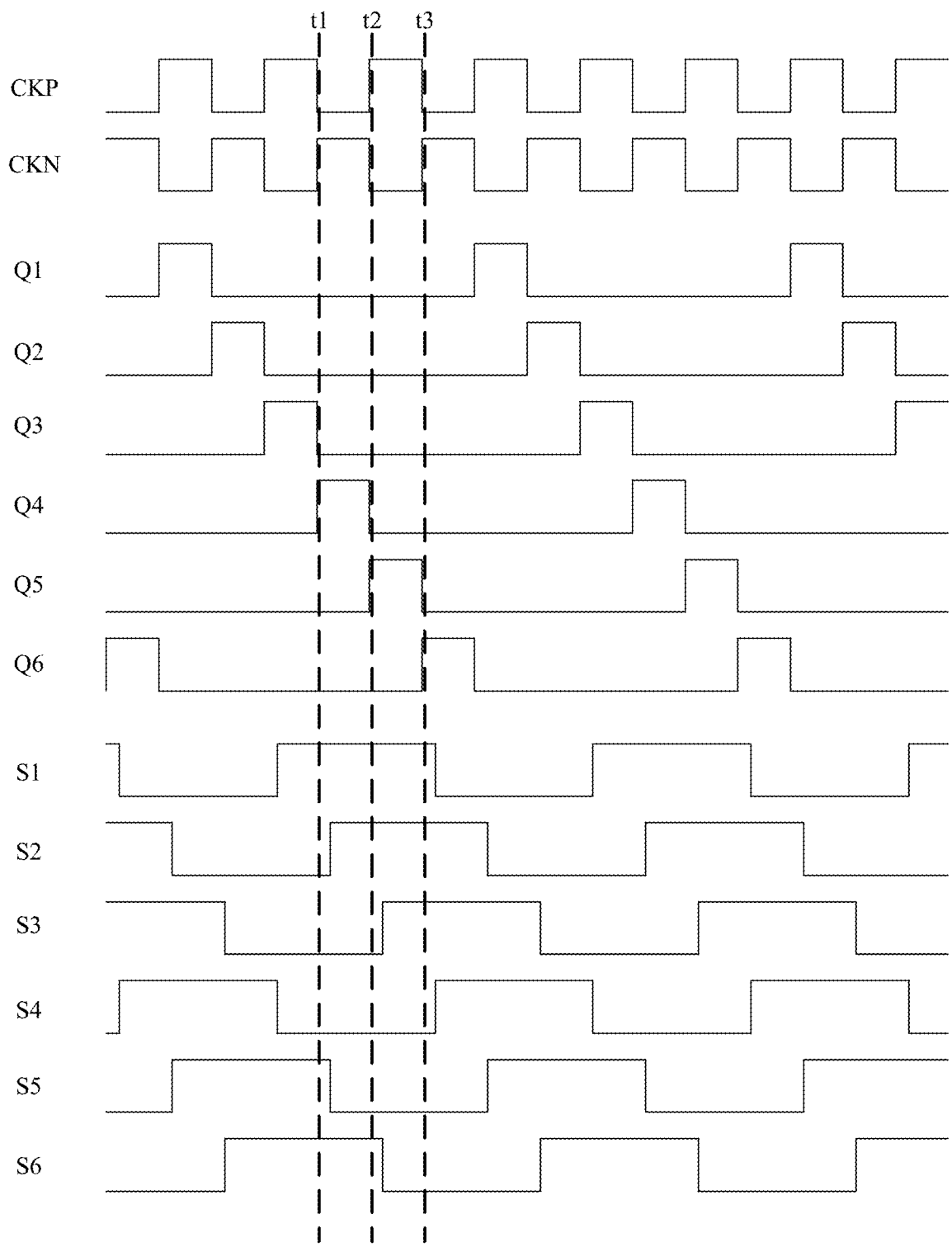
FIG. 8 is a waveform diagram of each port signal in the 6-phase non-overlapping clock generation circuit.

An operation principle of the 6-phase non-overlapping clock generation circuit 700 is described with reference to FIG. 7 and FIG. 8. The operation principle of the 6-phase non-overlapping clock generation circuit 700 is similar to that of the foregoing 8-phase non-overlapping clock circuit 400. FIG. 8 is a waveform diagram of each port signal in the 6-phase non-overlapping clock generation circuit 700, including waveform diagrams of differential clock signals CKN and CKP, and waveform diagrams of output port signals Q1 to Q6 of the first logic gates, and waveform diagrams of signals S1 to S6 at first selection signal input ends or second selection signal input ends of the first logic gates. Clock signal input ends of two adjacent stages of first logic gates are configured to receive the differential clock signals CKP and CKN. Excited by the differential clock signals CKP and CKN, the first logic gates perform the NOR operation based on initial states of the clock signals and the selection signals, and generate the 6-phase non-overlapping clock signals Q1 to Q6 respectively. A duty cycle of each of the 6-phase non-overlapping clock signals Q1 to Q6 is ⅙, and a phase difference between each phase clock signal and a clock signal of an adjacent phase is ⅙ of a cycle.

For example, for the first logic gate G11, at a moment t1, the clock signal CKN received at the first logic gate G11 jumps from a low level to a high level, the selection signal S5 is at the high level, and the selection signal S3 is at the low level. Therefore, after the NOR operation is performed, the generated output signal Q5 is at the low level. At a moment t2, the clock signal CKN received at the first logic gate G11 jumps from the high level to the low level, and both the selection signal S5 and the selection signal S3 are at the low level. Therefore, after the NOR operation is performed, the generated output signal Q5 is at the high level.

For the other five first logic gates, at the moment t2, at least one signal of the clock signals or the selection signals input at the other five first logic gates is at the high level. Therefore, an output signal obtained after the NOR operation is performed is at the low level. From the moment t2 to a moment t3, the output signals Q1 to Q4, and Q6 of the foregoing five first logic gates are all at the low level, and do not overlap the output signal Q5 generated at the first logic gate G11.

With reference to the structures and operation principles of the foregoing 4-phase, 6-phase, and 8-phase non-overlapping clock generation circuits provided in embodiments of this disclosure, a person skilled in the art may change a quantity of first logic gates, a quantity of first latches, and a connection relationship between the first logic gate and the first latch based on an actual requirement, to achieve a non-overlapping clock generation circuit of another phase.

For example, an embodiment of this disclosure further provides a non-overlapping clock generation circuit of a phase of any even number (2N, where N is an integer greater than or equal to 2), which may be configured to generate non-overlapping clock signals of a phase greater than or equal to 4 phases. The 2N-phase non-overlapping clock generation circuit includes at least 2N first logic gates and N first latches. As described above, the 2N first logic gates are connected in series in a first loop, and each first logic gate includes at least a first selection signal input end, a clock signal input end, and an output end. In addition, the first selection signal input ends and the output ends of the first logic gates are connected in series in a head-to-tail electrical connection manner to form the first loop. A first selection signal input end of each first logic gate is electrically connected to an output end of a first logic gate of a previous stage. The clock signal input end of the first logic gate is configured to receive an input clock signal, and the output end is configured to output multi-phase clock signals. For example, each first logic gate in the 2N first logic gates outputs one phase clock signal in the multi-phase clock signals. In addition, clock signals output at each logic gate do not overlap. Therefore, 2N-phase clock signals totally generated are non-overlapping clock signals. The foregoing first logic gate may be a NOR gate, or may be a NAND gate. The foregoing N first latches are also disposed in the first loop, and these first latches are respectively configured to latch a signal received at a first selection signal input end of at least one first logic gate in the 2N first logic gates. Details are as follows. Each first latch corresponds to two symmetrical first logic gates in the 2N first logic gates, to latch signals received at first selection signal input ends of the two first logic gates, as in the non-overlapping clock generation circuit 400 or the non-overlapping clock generation circuit 700.

The loop in this embodiment of this disclosure is not limited to including only the structure defined in this embodiment of this disclosure. For example, for the foregoing first loop, the first loop includes the 2N first logic gates that are connected in series and the N first latches that are also disposed in the first loop. The first loop may further include a circuit structure of another function.

In an implementation, the foregoing first logic gate is a first NOR gate, and each first latch includes the foregoing two second NOR gates symmetrically disposed in the first loop. Symmetrical disposing in the loop may be understood as that the two second NOR gates isolate the 2N first logic gates in the loop into two symmetrical parts, and each part includes N first logic gates. The foregoing second NOR gate is a two-input NOR gate, that is, the second NOR gate includes at least a first input end, a second input end, and an output end. For each first latch, a second input end of one second NOR gate is electrically connected to an output end of the other second NOR gate. Second input ends and output ends of the two second NOR gates are connected to each other to form an interlocking structure, which may be configured to latch signals received at first selection signal input ends of two first logic gates electrically connected to the output ends of the two second NOR gates.

The first latch is equivalent to implementing a function of an RS latch. The first input ends of the two second NOR gates are equivalent to an R input end and an S input end in the RS latch, and the output ends are equivalent to a Q output end and a $\overline{Q}$ output end in the RS latch. When levels of the R input end and the S input end change, levels of the Q output end and the $\overline{Q}$ output end change accordingly, to implement a latching function.

In an implementation, when N is a positive integer greater than or equal to 3, that is, when the generated clock signals are non-overlapping clocks of phases greater than or equal to 6 phases, the first NOR gate is a three-input NOR gate. Therefore, the first logic gate (namely, the first NOR gate)

further includes a second selection signal input end. A signal input at the second selection signal input end is from a signal at a first selection signal input end of another first logic gate in the loop. Details are as follows. A second selection signal input end of each first logic gate of the 2N first logic gates is electrically connected to a first selection signal input end of a first logic gate of a previous (N−2) stage. For example, for a 12-phase non-overlapping clock generation circuit, a second selection signal input end of one first logic gate is electrically connected to a first selection signal input end of a first logic gate of previous four stages. For a 6-phase non-overlapping clock generation circuit, a second selection signal input end of one first logic gate is electrically connected to a first selection signal input end of a first logic gate of a previous stage (namely, an adjacent first logic gate). The clock signal input ends of two adjacent first logic gates are respectively configured to receive the differential clock signals, namely, the CKP and the CKN. For example, a clock signal input end of a first-stage first logic gate is configured to receive the CKP, a second-stage first logic gate receives the CKN, a third-stage first logic gate receives the CKP, and so on. For two second NOR gates of any first latch in the N first latches, the two second NOR gates are symmetrically disposed in the loop. Therefore, N first logic gates are spaced between the two second NOR gates.

Figure 9:
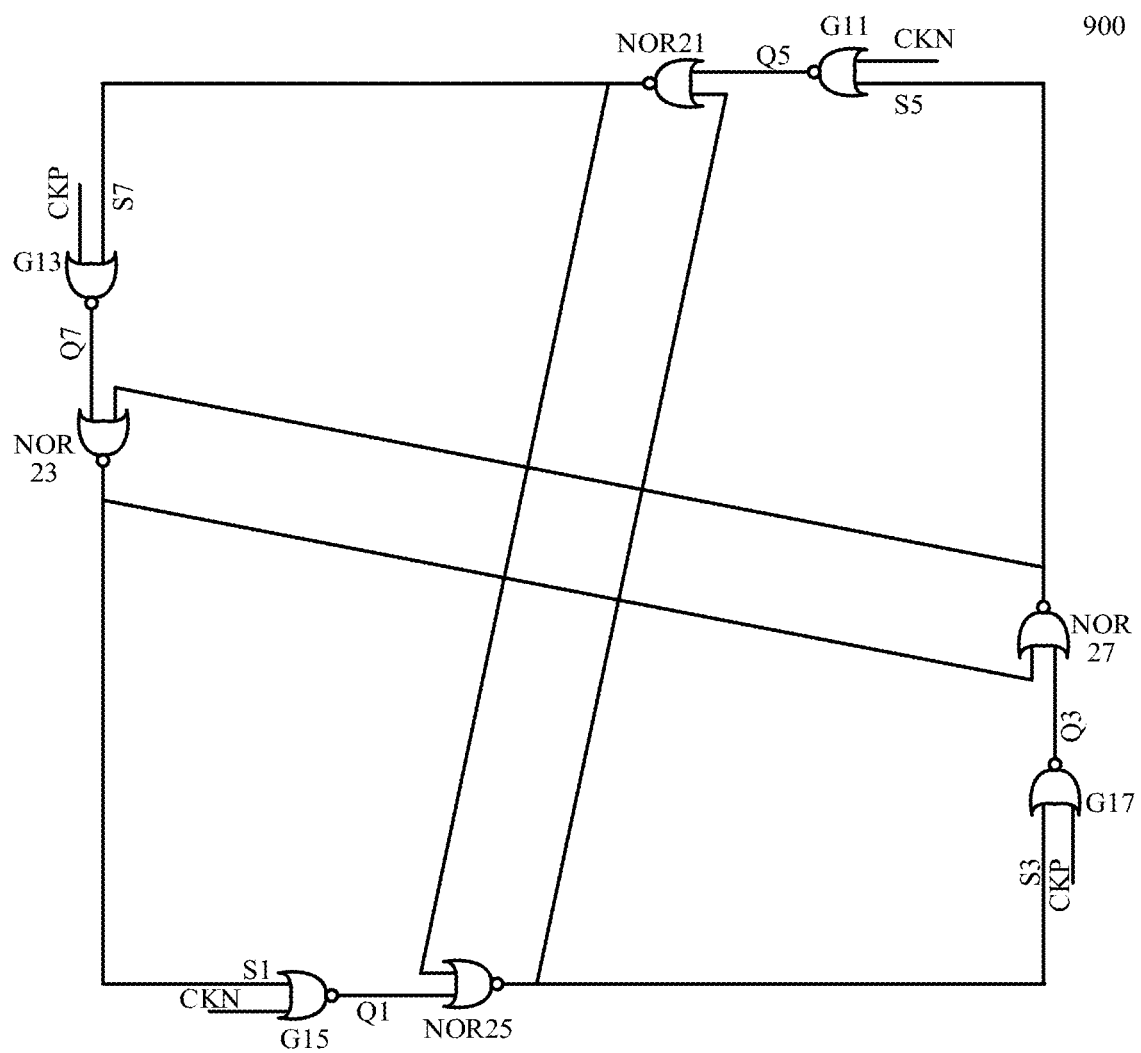
FIG. 9 is a 4-phase non-overlapping clock generation circuit according to an embodiment.

In an implementation, when N is 2, that is, when the generated clock signals are 4-phase non-overlapping clocks, the first NOR gate is a two-input NOR gate. The clock signal input ends of the adjacent two stages of first logic gates are respectively configured to receive the differential clock signals CKN and CKP. FIG. 9 shows a 4-phase non-overlapping clock generation circuit 900 according to an embodiment of this disclosure. Similar to the 8-phase non-overlapping clock generation circuit 400, the foregoing 4-phase non-overlapping clock generation circuit 900 includes four first logic gates and two first latches. As shown in FIG. 9, the foregoing four first logic gates (namely, first NOR gates) are respectively G11, G13, G15, and G17. The foregoing two first latches are respectively achieved through NOR gates NOR21, NOR23, NOR25, and NOR27, and two first logic gates are spaced between two second NOR gates in each first latch. The first logic gate and the first latch in the 4-phase non-overlapping clock generation circuit 900 in FIG. 9 have the same structures, functions, and connection manners as the first logic gate and the first latch in the 8-phase non-overlapping clock generation circuit 400. Details are not described herein again.

In addition to generating multi-phase non-overlapping clocks by using one loop in the foregoing embodiment, an embodiment of this disclosure further provides an 8-phase non-overlapping clock generation circuit achieved by using two loops. The 8-phase non-overlapping clock generation circuit includes a second loop 1010 shown in FIG. 10A and a first loop 1020 shown in FIG. 10B, where the second loop 1010 is based on input differential clock signals CKP and CKN. Eight two-input NAND gates are connected in series to form a loop to generate 4-phase overlapping clocks PQ1, PQ2, PQ3, and PQ4 with a duty cycle of 75%. The first loop 1020 generates 8-phase non-overlapping clocks based on the 4-phase overlapping clock signals PQ1, PQ2, PQ3, and PQ4 with the duty cycle of 75% generated by the second loop 1010.

Figure 10A:
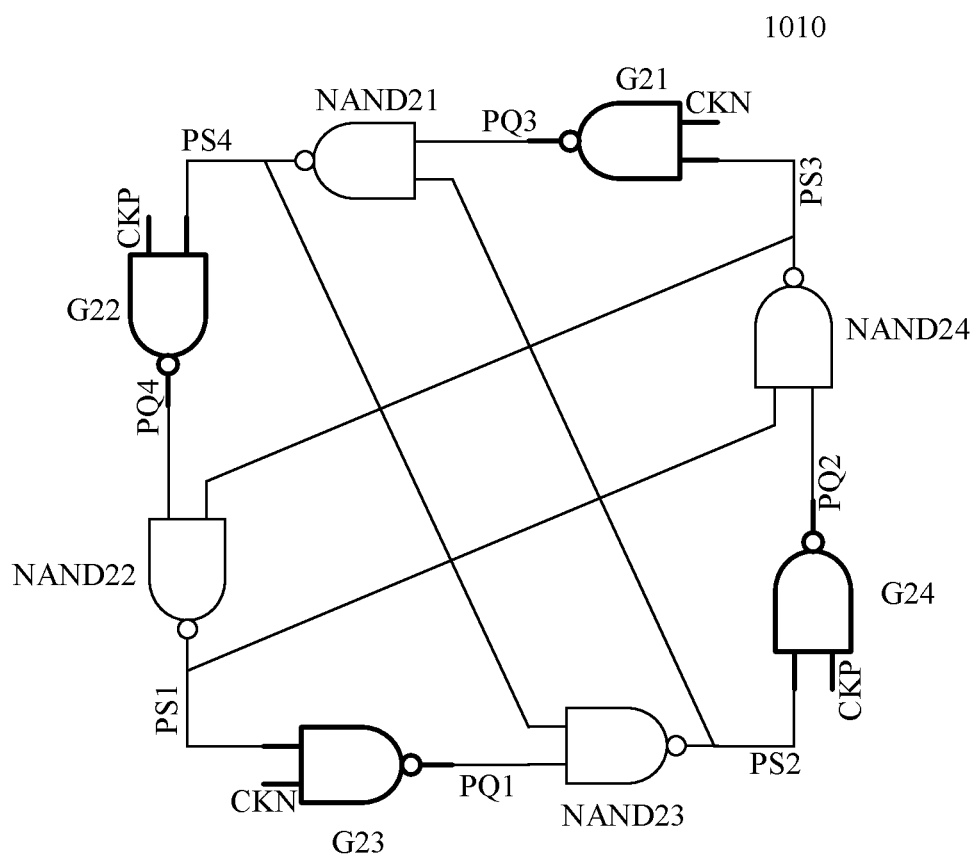
FIG. 10A is a first loop in another 8-phase clock generation circuit according to an embodiment.

As shown in FIG. 10A, the second loop 1010 includes four second logic gates G21, G22, G23, and G24, and two second latches. The second logic gate may be a NAND gate, or may be a NOR gate. An example in which the second logic gate is a NAND gate is used for description in this embodiment of this disclosure. The foregoing two second latches are respectively achieved through NAND gates NAND21, NAND22, NAND23, and NAND24 shown in FIG. 10A. When the second logic gate is achieved through a NOR gate, the foregoing two second latches may also be achieved through four NOR gates respectively. The second latch in this embodiment of this disclosure is described by using the NAND gate as an example.

A circuit structure of the second loop 1010 shown in FIG. 10A is similar to that of the 4-phase non-overlapping clock generation circuit 900 shown in FIG. 9. A difference lies in that the first NOR gate, and the second NOR gate in the first latch that are in the 4-phase non-overlapping clock generation circuit 900 are all replaced with NAND gates. Because all the NOR gates are replaced with the NAND gates, intermediate clock signals PQ1, PQ2, PQ3, and PQ4 generated at output ends of the four second logic gates G21, G22, G23, and G24 are 4-phase overlapping clocks with a duty cycle of 75%.

Figure 11A:
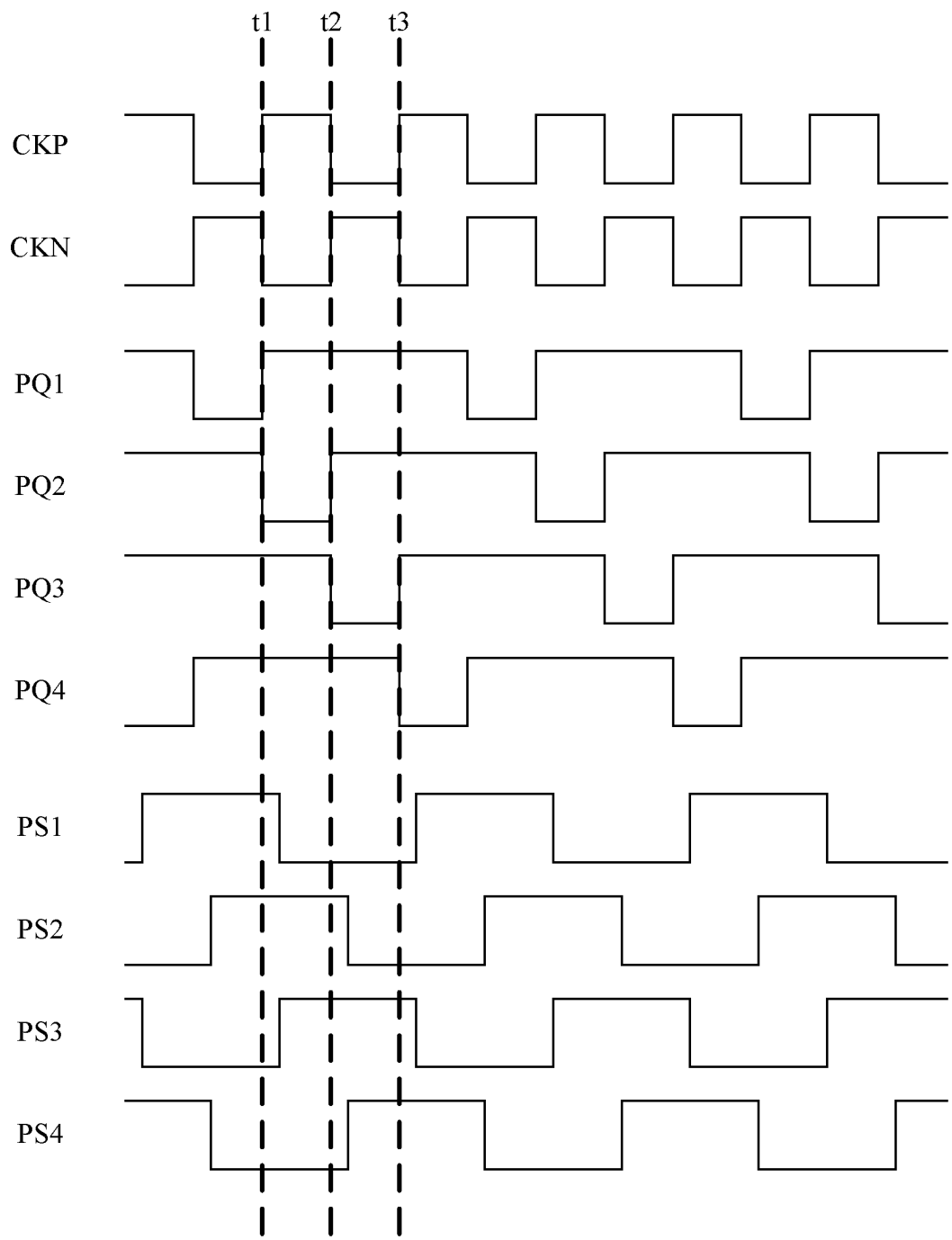
FIG. 11A is a waveform diagram of each port signal in the first loop.

FIG. 11A shows a waveform diagram of each port signal in the second loop 1010. Clock signal input ends of two adjacent stages of second logic gates are configured to receive the differential clock signals CKP and CKN. For example, two adjacent stages of second logic gates G21 and G22 respectively receive the clock signal CKN and the clock signal CKP. Frequencies of the differential clock signals CKP and CKN are the same, and a phase difference is 180°. Excited by the differential clock signals CKP and CKN, the second logic gates perform a NAND operation based on initial states of the clock signals and the selection signals, and generate 4-phase overlapping clock signals PQ1 to PQ4 with a duty cycle of 75% respectively. In addition, a phase difference between each phase clock signal and a clock signal of an adjacent phase is ¼ of a cycle.

For example, for the second logic gate G21, at a moment t1, the clock signal CKN received at the second logic gate G21 jumps from a high level to a low level, and a selection signal PS3 is at the low level. Therefore, after the NAND operation is performed, the generated output signal PQ3 is at the high level. At a moment t2, the clock signal CKN received at the second logic gate G21 jumps from the low level to the high level, and the selection signal PS3 is at the high level. Therefore, after the NAND operation is performed, the generated output signal PQ3 is at the low level.

For the other three second logic gates, at the moment t2, clock signals or selection signals input at the other three second logic gates may also be at the low level. Therefore, an output signal obtained after the NAND operation is performed is at the high level. In this way, output signals generated at the other three second logic gates overlap the second logic gate G21. Therefore, the first loop 1020 needs to continue to further process the 4-phase overlapping clock signals PQ1 to PQ4 with the duty cycle of 75%, to reduce the duty cycle of PQ1 to PQ4 to 25%.

Figure 10B:
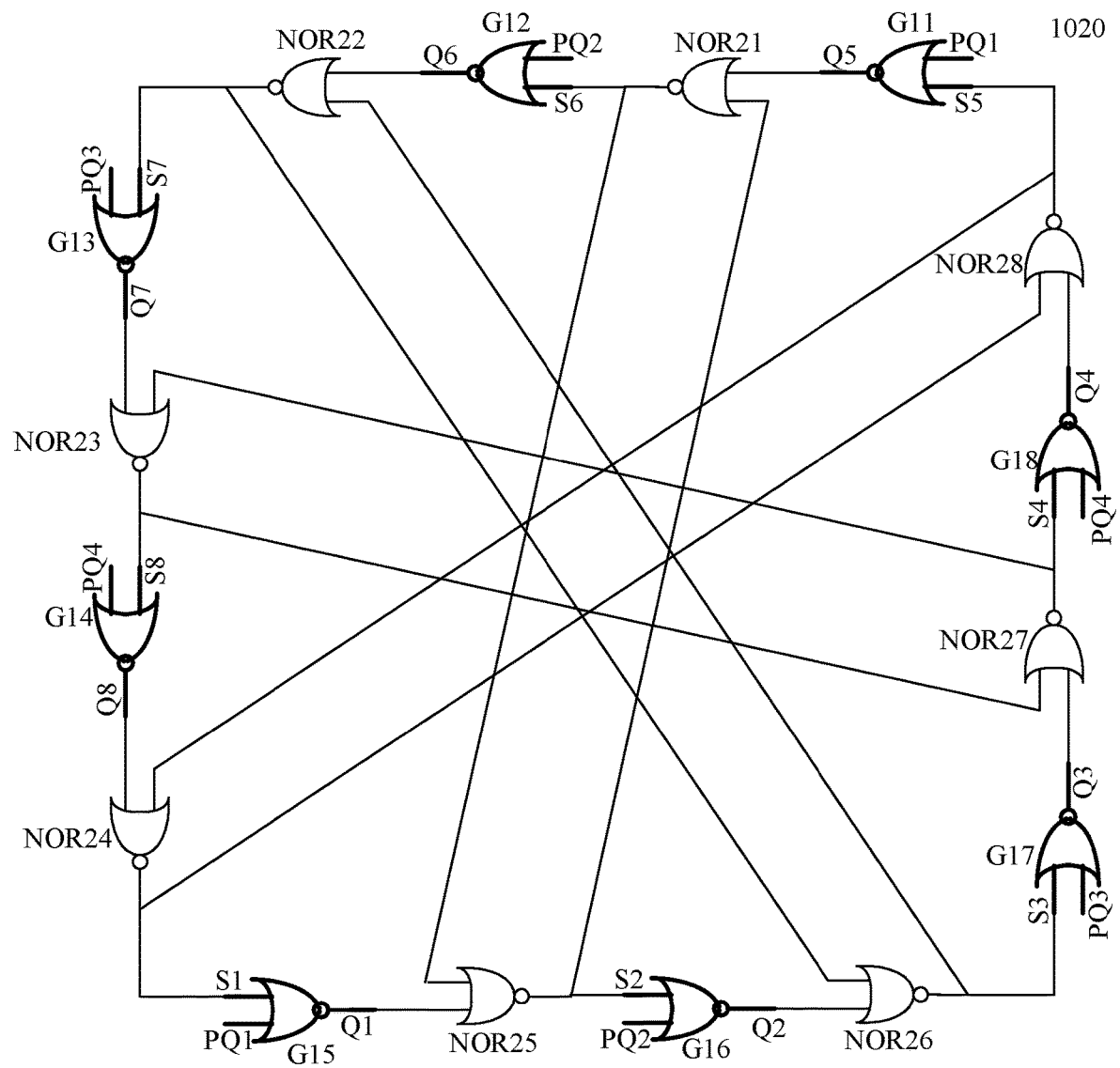
FIG. 10B is a second loop in another 8-phase clock generation circuit according to an embodiment.

The first loop 1020 shown in FIG. 10B receives the 4-phase overlapping clock signals PQ1 to PQ4 generated by the second loop 1010, and generates 8-phase non-overlapping clocks Q1 to Q8 after a logical operation is performed. A structure of the first loop 1020 is similar to that of the 8-phase non-overlapping clock generation circuit 400, and similarities are not described again. A difference is that the first logic gates in the first loop 1020 are two-input NOR gates, and clock signal input ends in eight first logic gates, namely, input ends of G11, G12, G13, G14, G15, G16, G17, and G18, are electrically connected to output ends of the second logic gates G21, G22, G23, and G24 in the second loop 1010 respectively. A specific electrical connection relationship is as follows. Two clock signal input ends between which three first logic gates are spaced receive an intermediate clock signal output at a same second logic gate. In other words, clock signal input ends of two first logic gates that are symmetrical in the loop receive an intermediate clock signal output at a same second logic gate.

For example, three first logic gates are spaced between the first logic gate G11 and the first logic gate G15, and the first logic gate G11 and the first logic gate G15 are also two symmetrical first logic gates in the first loop 1020. Both a signal received at a clock signal input end of the first logic gate G11 and a signal received at a clock signal input end of the first logic gate G15 are PQ1. Similarly, both a signal received at a clock signal input end of the first logic gate G12 and a signal received at a clock signal input end of the first logic gate G16 are PQ2, both a signal received at a clock signal input end of the first logic gate G13 and a signal received at a clock signal input end of the first logic gate G17 are PQ3, and both a signal received at a clock signal input end of the first logic gate G14 and a signal received at a clock signal input end of the first logic gate G18 are PQ4.

Figure 11B:
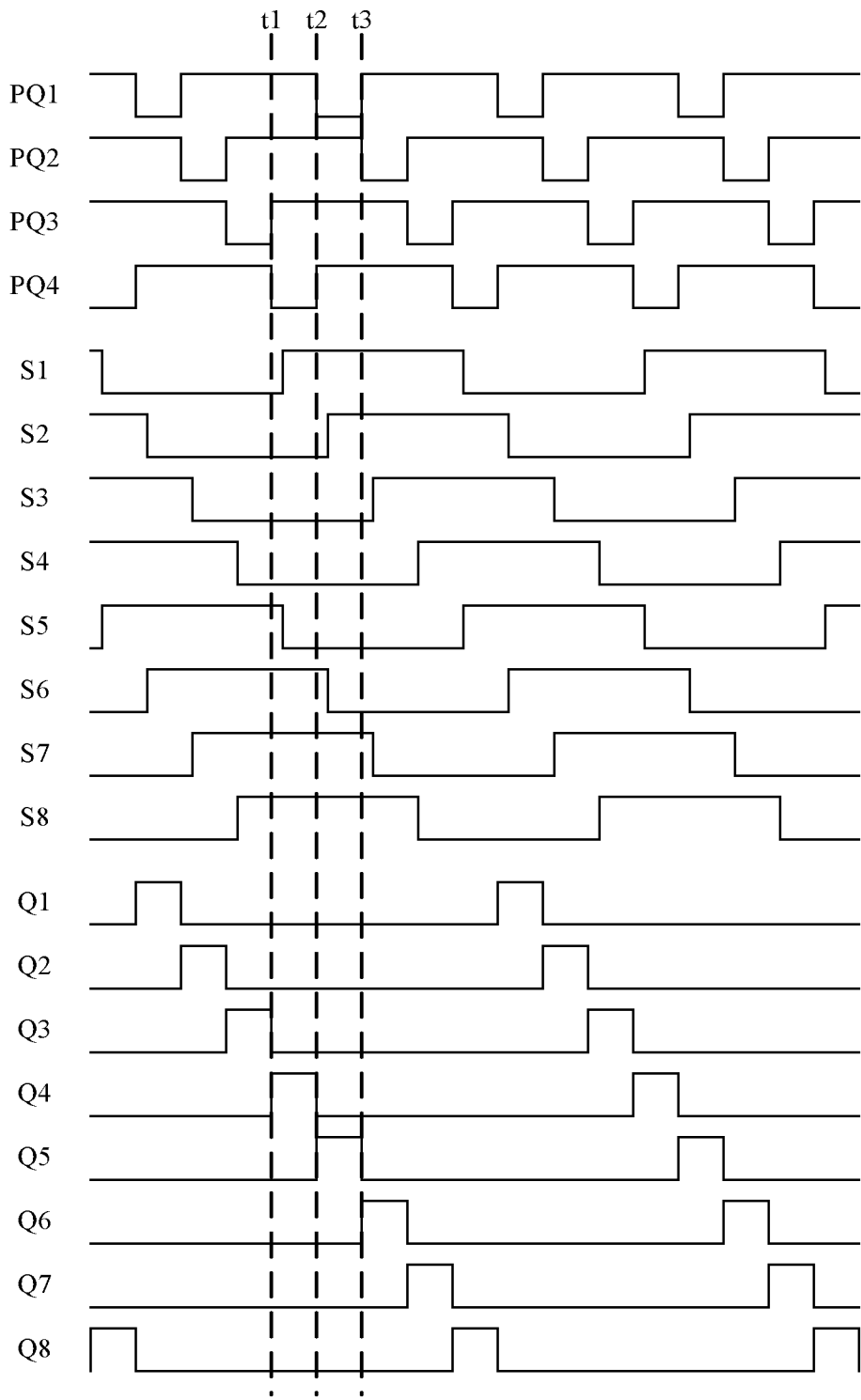
FIG. 11B is a waveform diagram of each port signal in the second loop.

FIG. 11B is a waveform diagram of each port signal in the second loop. Excited by the overlapping clock signals PQ1 to PQ4 generated by the second loop 1010, the first logic gates perform a NOR operation based on initial states of PQ1 to PQ4 and the selection signals, and generate the 8-phase non-overlapping clock signals Q1 to Q8 respectively. A duty cycle of each of the 8-phase non-overlapping clock signals Q1 to Q8 is ⅛, and a phase difference between each phase clock signal and a clock signal of an adjacent phase is ⅛ of a cycle.

For example, for the first logic gate G11, at a moment t1, the intermediate clock signal PQ1 received at the first logic gate G11 is at a high level, and the selection signal S5 is at the high level. Therefore, after the NOR operation is performed, the generated output signal Q5 is at a low level. At a moment t2, the intermediate clock signal PQ1 received at the first logic gate G11 jumps from the high level to the low level, and the selection signal S5 is at the low level. Therefore, after the NOR operation is performed, the generated output signal Q5 jumps from the low level to the high level.

For the other seven first logic gates, at the moment t2, at least one signal of the intermediate clock signals or the selection signals input at the other seven first logic gates is at the high level. Therefore, an output signal obtained after the NOR operation is performed is at the low level. From the moment t2 to a moment t3, the output signals of the seven first logic gates are all at the low level, and do not overlap the output signal Q5 generated at the first logic gate G11.

By changing a quantity of first logic gates, a quantity of second NOR gates, a quantity of second logic gates, a quantity of second latches, and a connection relationship between circuits in the 8-phase non-overlapping clock generation circuit, another multi-phase non-overlapping clock generation circuit, for example, an even number-phase non-overlapping clock generation circuit, such as 4-phase, 6-phase, 10-phase, or 12-phase non-overlapping clock generation circuit, may be achieved, where the even number is greater than or equal to 4.

Therefore, for an 2N-phase non-overlapping clock generation circuit, in an implementation, the foregoing 2N-phase non-overlapping clock generation circuit may be achieved through the first loop and the second loop. Details are as follows. Based on the foregoing 2N-phase non-overlapping clock generation circuit, another 2N-phase non-overlapping clock generation circuit provided in this embodiment of this disclosure further includes the second loop, and the second loop includes N second logic gates and N/2 second latches. The N second logic gates are connected in series in the second loop, and each second logic gate includes a selection signal input end, a clock signal input end and an output end respectively. The selection signal input ends and the output ends of the second logic gates are connected in series in a head-to-tail electrical connection manner to form the second loop. A selection signal input end of each second logic gate is electrically connected to an output end of a second logic gate of a previous stage. The foregoing second logic gates are all NOR gates or are all NAND gates. The clock signal input end of the second logic gate is configured to receive a clock signal, and clock signal input ends of two adjacent second logic gates are configured to receive differential clock signals, namely, CKP and CKN. The output ends of the N second logic gates are configured to output N intermediate clock signals to clock signal input ends of the 2N first NOR gates, and two first NOR gates between which N−1 first NOR gates are spaced receive an intermediate clock signal output at an output end of a same second logic gate. In other words, clock signal input ends of two first logic gates that are symmetrical in the first loop receive an intermediate clock signal output at a same second logic gate.

For example, for a 6-phase non-overlapping clock generation circuit, N=3. Therefore, a second loop thereof includes six first logic gates and three second logic gates. In addition, a first first logic gate and a fourth first logic gate in the second loop are configured to receive an intermediate signal output at an output end of a same second logic gate (for example, a first second logic gate in the second loop). A case of another second logic gate can be deduced by analogy, and details are not described herein again.

For the foregoing N/2 second latches, each second latch is configured to latch a signal received at a selection signal input end of the N second logic gates. A principle of the second latch for latching a signal is the same as that of the first latch.

In addition, the foregoing first NOR gate is a two-input NOR gate, a signal input at an input clock signal end of the first logic gate (the first NOR gate) is an intermediate clock signal, and N first logic gates are spaced between two second NOR gates in each first latch. A quantity of first NOR gates is 2N, a quantity of second NOR gates is 2N, multi-phase clock signals are 2N-phase clock signals, and N is a positive integer greater than 1.

In an implementation, the foregoing second logic gate is a two-input first NAND gate, and the second latch includes two two-input second NAND gates symmetrically disposed in the second loop. The second NAND gate includes a first input end, a second input end, and an output end. For two second NAND gates in each second latch, a second input end of each second NAND gate is electrically connected to an output end of the other second NAND gate. The two second NAND gates are configured to latch signals received at selection signal input ends of two second logic gates electrically connected to output ends of the two second NAND gates, and clock signal input ends of two adjacent stages of second logic gates in the N second logic gates in the second loop are respectively configured to receive differential clock signals. N/2 second logic gates are spaced between two second NAND gates in each second latch, a quantity of first NAND gates is N, and a quantity of second NAND gates is N.

Figure 12:
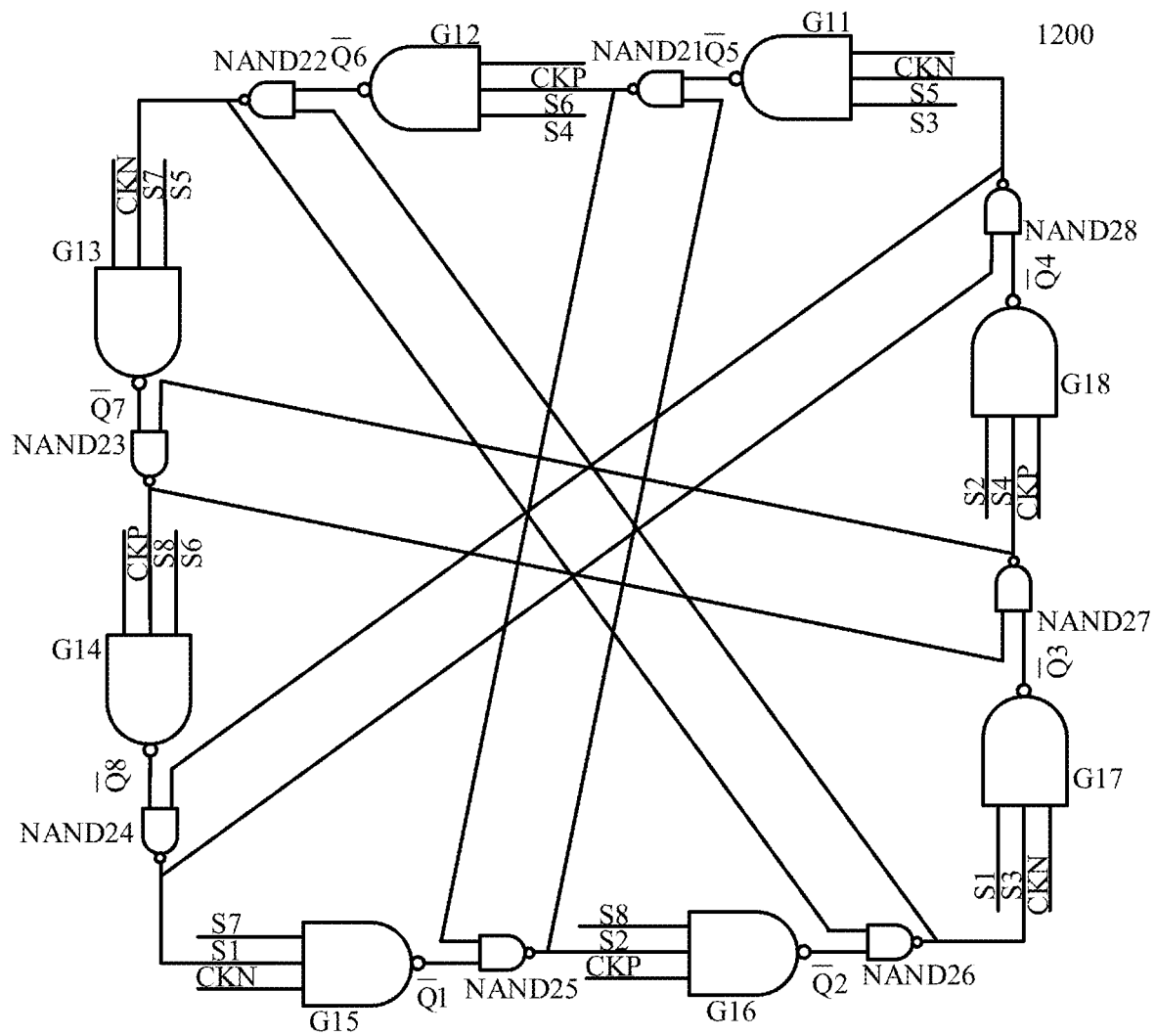
FIG. 12 is still another 8-phase clock generation circuit according to an embodiment.

The first logic gate and the first latch in the multi-phase non-overlapping clock generation circuit may be achieved through a NAND gate in addition to a NOR gate. FIG. 12 shows another 8-phase non-overlapping clock generation circuit 1200 according to an embodiment of this disclosure. A circuit structure of the 8-phase non-overlapping clock generation circuit 1200 is similar to that of the 8-phase non-overlapping clock generation circuit 400. A difference lies in that first logic gates in the 8-phase non-overlapping clock generation circuit 1200 are all NAND gates, and first latches are also achieved through NAND gates symmetrically disposed in a loop. In addition, the 8-phase non-overlapping clock generation circuit 1200 further includes eight phase inverters. Details are as follows. Eight first logic gates G11, G12, G13, G14, G15, G16, G17, and G18 in the 8-phase non-overlapping clock generation circuit 1200 are all NAND gates. Four first latches are achieved through NAND21, NAND22, NAND23, NAND24, NAND25, NAND26, NAND27, and NAND28. In addition, because the first logic gates are NAND gates, and multi-phase clocks output through the NAND gates are multi-phase overlapping clocks with a duty cycle of ⅞, eight first phase inverters are further required to respectively invert clock signals $\overline{Q1}$ to $\overline{Q8}$ generated at the first logic gates, to obtain 8-phase non-overlapping clock signals Q1-Q8.

Figure 13:
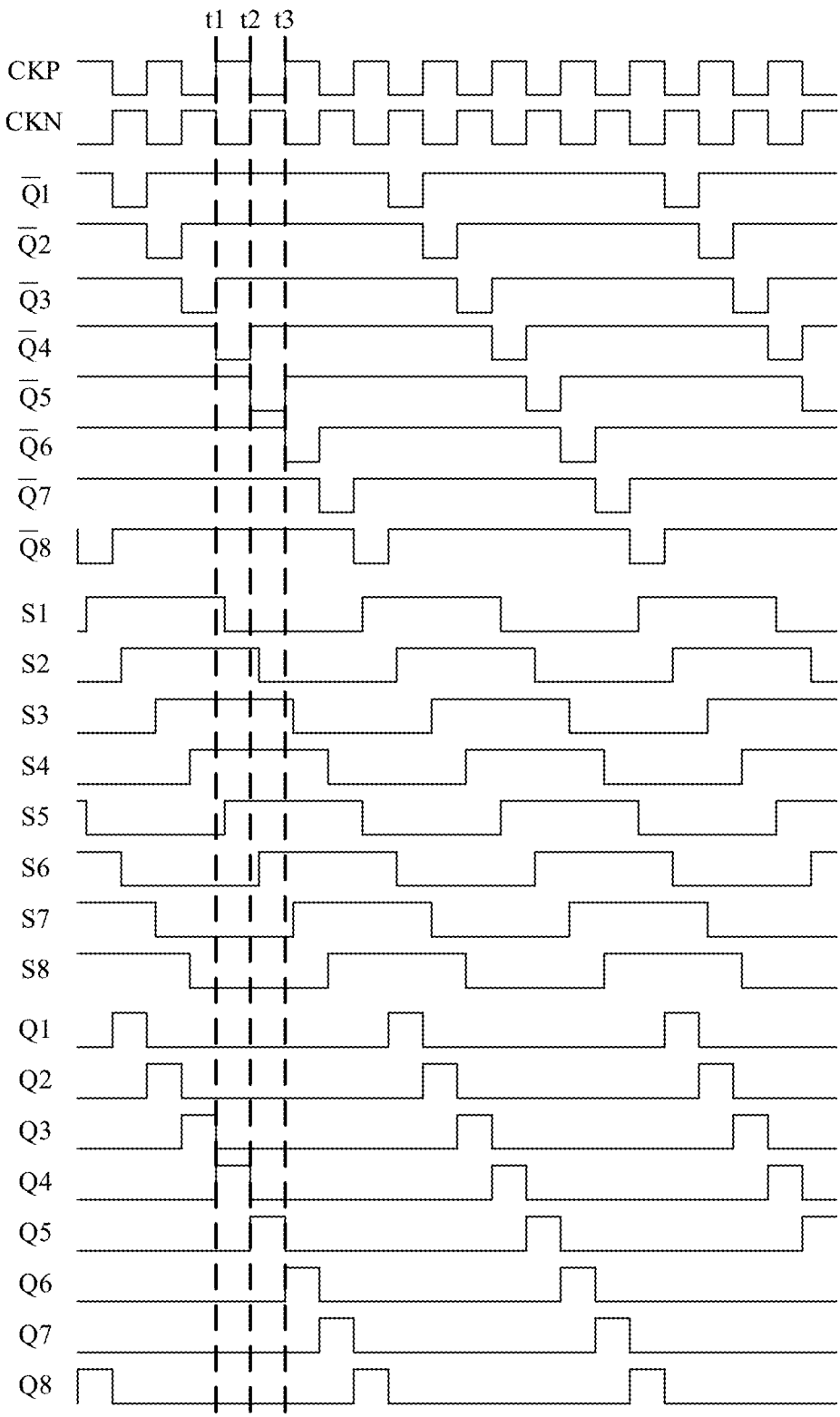
FIG. 13 is a waveform diagram of each port signal in still another 8-phase clock generation circuit according to an embodiment.

An operation principle of the 8-phase non-overlapping clock generation circuit 1200 is the same as that of the 8-phase non-overlapping clock generation circuit 400. A waveform diagram of each port signal in the 8-phase non-overlapping clock generation circuit 1200 is described with reference to FIG. 12 and FIG. 13. FIG. 13 is the waveform diagram of each port signal in the 8-phase non-overlapping clock generation circuit 1200, including waveform diagrams of differential clock signals CKN and CKP, waveform diagrams of output port signals $\overline{Q1}$ to $\overline{Q8}$ of first logic gates, waveform diagrams of signals S1 to S8 at first selection signal input ends or second selection signal input ends of the first logic gates, and waveform diagrams of output port signals Q1 to Q8 of the 8-phase non-overlapping clock generation circuit 1200.

Clock signal input ends of two adjacent stages of first logic gates are configured to receive the differential clock signals CKP and CKN. For example, the adjacent two stages of first logic gates G11 and G12 respectively receive the clock signal CKN and the clock signal CKP. Excited by the differential clock signals CKP and CKN, the first logic gates perform a NAND operation based on an initial state of the clock signal CKN or CKP and an initial state of a first selection signal, and generate 8-phase overlapping clock signals $\overline{Q1}$ to $\overline{Q8}$ respectively. A duty cycle of each of $\overline{Q1}$ to $\overline{Q8}$ is ⅞, and a phase difference between each phase clock signal and a clock signal of an adjacent phase is ⅛ of a cycle.

For example, for the first logic gate G11, at a moment t1, the clock signal CKN received at the first logic gate G11 jumps from a high level to a low level, the selection signal S5 is at the high level, and the selection signal S3 is at the low level. Therefore, after a NOR operation is performed, the generated output signal Q5 is at the high level. At a moment t2, the clock signal CKN received at the first logic gate G11 jumps from the low level to the high level, and both the selection signal S5 and the selection signal S3 are at the high level. Therefore, after a NAND operation is performed, the generated output signal Q5 jumps from the high level to the low level at the moment t2.

For the other seven first logic gates, at the moment t2, at least one signal of the clock signals or the selection signals input at the other seven first logic gates is at the low level. Therefore, an output signal obtained after the NAND operation is performed is at the high level. From the moment t2 to a moment t3, the output signals Q1 to Q4 and Q6 to Q8 of the seven first logic gates are all at the high level. Therefore, after the output signals are inverted by the phase inverters, non-overlapping clock signals obtained finally do not overlap the output signal Q5 generated at the first logic gate G11.

For 2N phases, the NOR gates in the foregoing 2N-phase non-overlapping clock generation circuit may be replaced with structures of the NAND gates and the phase inverters to generate 8-phase non-overlapping clock signals. Therefore, an embodiment of this disclosure provides another 2N non-overlapping clock generation circuit achieved based on a NAND gate.

Details are as follows. In an implementation, the 2N-phase non-overlapping clock generation circuit further includes 2N first phase inverters. The foregoing first logic gate is a third NAND gate, and each first latch includes two fourth NAND gates symmetrically disposed in the foregoing first loop. Symmetrical disposing in the first loop may be understood as that the two fourth NAND gates isolate the 2N first logic gates in the first loop into two symmetrical parts, and each part includes N first logic gates. An output end of each first logic gate outputs multi-phase clock signals through one of the 2N first phase inverters. In other words, the output end of each first logic gate first performs phase inversion and then outputs the multi-phase clock signals, to generate non-overlapping multi-phase clock signals. Each first latch is configured to latch signals received at first selection signal input ends of corresponding two first logic gates. The foregoing third NAND gate is a two-input NOR gate, that is, the third NAND gate includes at least a first input end, a second input end, and an output end. For each first latch, a second input end of one fourth NAND gate is electrically connected to an output end of the other fourth NAND gate. Second input ends and output ends of the two fourth NAND gates are connected to each other to form an interlocking structure, which may be configured to latch signals received at first selection signal input ends of two first logic gates electrically connected to the output ends of the two fourth NAND gates. Output ends of the first logic gates output 2N-phase non-overlapping clock signals through 2N first phase inverters respectively.

In an implementation, when N is a positive integer greater than or equal to 3, that is, when the generated clock signals are non-overlapping clocks of phases greater than or equal to 6 phases, the third NAND gate is a three-input NAND gate. Therefore, the first logic gate (namely, the third NAND gate) further includes a second selection signal input end. A signal input at the second selection signal input end is from a signal at a first selection signal input end of another first logic gate in the first loop. Details are as follows. A second selection signal input end of each first logic gate of the 2N first logic gates is electrically connected to a first selection signal input end of a first logic gate of a previous (N−2) stage. The clock signal input ends of two adjacent first logic gates are respectively configured to receive the differential clock signals, namely, the CKP and the CKN. For two fourth NAND gates of any first latch in the N first latches, the two fourth NAND gates are symmetrically disposed in the loop. Therefore, N first logic gates are spaced between the two fourth NAND gates.

In an implementation, when N is 2, that is, when the generated clock signals are 4-phase non-overlapping clocks, the third NAND gate is a two-input NAND gate. The clock signal input ends of the adjacent two stages of first logic gates are respectively configured to receive the differential clock signals CKN and CKP. Two first logic gates are spaced between two fourth NAND gates in each first latch. The first logic gate and the first latch have the same structures, functions, and connection manners as the first logic gate and the first latch in the 8-phase non-overlapping clock generation circuit 1200. Details are not described herein again.

In an implementation, the foregoing 2N-phase non-overlapping clock generation circuit may be achieved through a first loop and a second loop. Details are as follows. Based on the foregoing 2N-phase non-overlapping clock generation circuit, another 2N-phase non-overlapping clock generation circuit provided in this embodiment of this disclosure further includes a first loop, and the first loop includes N second logic gates and N/2 second latches. Each second logic gate includes a selection signal input end, a clock signal input end, and an output end. The selection signal input ends and the output ends of the second logic gates are connected in series in a head-to-tail electrical connection manner to form the loop. The foregoing second logic gates are all NOR gates or are all NAND gates. The clock signal input end of the second logic gate is configured to receive a clock signal, and clock signal input ends of two adjacent second logic gates are configured to receive differential clock signals, namely, CKP and CKN. The output ends of the foregoing N second logic gates are configured to output N intermediate clock signals to clock signal input ends of the foregoing 2N third NAND gates, and two third NAND gates between which N−1 third NAND gates are spaced receive an intermediate clock signal output at an output end of a same second logic gate.

In an implementation, the foregoing second logic gate is a two-input fifth NOR gate, and the second latch includes two two-input sixth NOR gates symmetrically disposed in the loop. The sixth NOR gate includes a first input end, a second input end, and an output end. For two sixth NOR gates in each second latch, a second input end of each sixth NOR gate is electrically connected to an output end of the other sixth NOR gate. The two sixth NOR gates are configured to latch signals received at selection signal input ends of two second logic gates electrically connected to output ends of the two sixth NOR gates, and clock signal input ends of two adjacent stages of second logic gates in the N second logic gates are respectively configured to receive differential clock signals. N/2 second logic gates are spaced between two sixth NOR gates in each second latch, a quantity of fifth NOR gates is N, and a quantity of sixth NOR gates is N.

Figure 14:
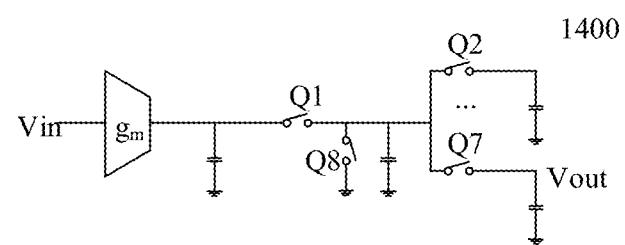
FIG. 14 is a schematic diagram of a signal processing apparatus according to an embodiment.

In addition to being used in radio frequency signal processing, the 2N-phase non-overlapping clock generation circuit provided in this embodiment of this disclosure may be further used in a switched capacitor filter SCF. For example, an embodiment of this disclosure further provides a signal processing apparatus, including a switched capacitor filter and any 2N-phase non-overlapping clock generation circuit provided in embodiments of this disclosure. Using N=4 as an example, FIG. 14 shows a switched capacitor filter 1400 in which 8-phase non-overlapping clocks are required. The switched capacitor filter includes a transconductance $g_m$, a switch Q1 connected to the $g_m$, switches Q2 to Q7 connected in parallel, a grounded switch Q8, and a plurality of grounded capacitors. The switches Q1 to Q8 respectively receive 8-phase non-overlapping clock signals, and turning-off and turning-on of the switches Q1 to Q8 are implemented based on the 8-phase non-overlapping clock signals, so that a filtering function is implemented.

An embodiment of this disclosure further provides another signal processing apparatus, including an ADC and any 2N-phase non-overlapping clock generation circuit provided in embodiments of this disclosure. The 2N-phase non-overlapping clock generation circuit is configured to generate 2N-phase non-overlapping clock signals based on differential clock signals, and input the 2N-phase non-overlapping clock signals to the ADC. The ADC implements a function of 2N-phase time interleaving analog-to-digital conversion under the control of the 2N-phase non-overlapping clock signals.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A multi-phase clock generation circuit comprising:
   a first loop;
   a plurality of first logic gates coupled in series in the first loop, wherein the first logic gates are NOR gates or NAND gates, and wherein each of the first logic gates comprises:
      a first selection signal input end electrically coupled to a first output end of a first logic gate of a first previous stage;
      a first clock signal input end configured to receive input clock signals; and
      a second output end, configured to output multi-phase clock signals; and
   a plurality of first latches disposed in the first loop and configured to latch a first signal received at a first selection signal input end of at least one first logic gate of the first logic gates.

2. The multi-phase clock generation circuit of claim 1, wherein each of the first logic gates is a first NOR gate, wherein each of the first latches is configured to latch second signals received at first selection signal input ends of two first logic gates in the at least one first logic gate and comprises two second NOR gates symmetrically disposed in the first loop, and wherein each of the two second NOR gates is a first two-input NOR gate and comprises:
   a first input end;
   a second input end electrically coupled to a third output end of a remaining second NOR gate of the two second NOR gates; and
   a fourth output end,
   wherein the third output end and the fourth output end are further configured to respectively electrically couple to the first selection signal input ends.

3. The multi-phase clock generation circuit of claim 2, wherein the first NOR gate is a three-input NOR gate, wherein the input clock signals are differential clock signals, wherein each of the first logic gates further comprises a second selection signal input end electrically coupled to a first selection signal input end of a first logic gate of a previous (N−2) stage, wherein second clock signal input ends of first logic gates of every two adjacent stages in the first loop are configured to respectively receive two clock signals in the differential clock signals, wherein N first logic gates are spaced between the two second NOR gates, wherein a quantity of the first logic gates is 2N, wherein a quantity of the first latches is N, wherein the multi-phase clock signals are 2N-phase clock signals, and wherein N is an integer greater than or equal to 3.

4. The multi-phase clock generation circuit of claim 2, wherein the first NOR gate is a second two-input NOR gate, wherein the input clock signals are differential clock signals, wherein second clock signal input ends of first logic gates of every two adjacent stages in the first loop are configured to respectively receive two clock signals in the differential clock signals, wherein two first logic gates are spaced between the two second NOR gates, wherein a quantity of the first logic gates is 4, wherein a quantity of the first latches is 2, and wherein the multi-phase clock signals are 4-phase clocks signals.

5. The multi-phase clock generation circuit of claim 2, wherein the first NOR gate is a second two-input NOR gate, wherein the input clock signals are intermediate clock signals, wherein N first logic gates are spaced between the two second NOR gates, wherein a quantity of the first logic gates is 2N, wherein a quantity of the first latches is N, wherein the multi-phase clock signals are 2N-phase clock signals, wherein N is an even number greater than 1, and wherein the multi-phase clock generation circuit further comprises:
 a second loop;
 N second logic gates coupled in series in the second loop, wherein the N second logic gates are NOR gates or NAND gates, wherein each of the N second logic gates comprises:
  a second selection signal input, end electrically coupled to a fifth output end of a second logic gate of a second previous stage;
  a second clock signal input end, wherein second clock signal input ends of the N second logic gates are configured to receive differential clock signals; and
  a sixth output end, wherein sixth output ends of the N second logic gates are configured to output N intermediate clock signals to third clock signal input ends of the 2N first logic gates, and wherein two first logic gates at an interval of N−1 first logic gates receive intermediate clock signals output by a seventh output end of a same second logic gate; and
 N/2 second latches disposed in the second loop and configured to respectively latch a third signal received at a second selection signal input end of at least one second logic gate of the N second logic gates.

6. The multi-phase clock generation circuit of claim 5, wherein each of the N second logic gates is a first NAND gate, wherein each of the N/2 second latches is configured to latch fourth signals received at second selection signal input ends of two second logic gates in the at least one second logic gate and comprises two second NAND gates symmetrically disposed in the second loop, wherein the first NAND gate is a first two-input NAND gate, and wherein each of the two second NAND gates is a second two-input NAND gate and comprises:
 a third input end;
 a fourth input end electrically coupled to an eighth output end of a remaining second NAND gate of the two second NAND gates; and
 a ninth output end,
 wherein the eighth output end and the ninth output end are further respectively electrically coupled to the second selection signal input ends, wherein fourth clock signal input ends of second logic gates of every two adjacent stages in the second loop are respectively configured to receive two clock signals in the differential clock signals, and wherein N/2 second logic gates are spaced between the two second NAND gates.

7. The multi-phase clock generation circuit of claim 1, further comprising a plurality of first phase inverters, wherein the second output end is configured to output the multi-phase clock signals through one first phase inverter in the first phase inverters, wherein each of the first logic gates is a first NAND gate, wherein each of the first latches is configured to latch second signals received at first selection signal input ends of two first logic gates in the at least one first logic gate and comprises two second NAND gates symmetrically disposed in the first loop, wherein each of the two second NAND gates is a first two-input NAND gate and comprises:
 a first input end;
 a second input end electrically coupled to a third output end of a remaining second NAND gate of the two second NAND gates; and
 a fourth output end,
 wherein the third output end and the fourth output end are further configured to respectively electrically couple to the first selection signal input ends.

8. The multi-phase clock generation circuit of claim 7, wherein the first NAND gate is a three-input NAND gate, wherein the input clock signals are differential clock signals, wherein each of the first logic gates further comprises a second selection signal input end electrically coupled to a first selection signal input end of a first logic gate of a previous (N−2) stage, wherein second clock signal input ends of every two adjacent levels of first logic gates in the first loop are configured to respectively receive two clock signals in the differential clock signals, wherein N first logic gates are spaced between the two second NAND gates, wherein a quantity of the first logic gates is 2N, wherein a quantity of the first latches is N, wherein the multi-phase clock signals are 2N-phase clock signals, and wherein N is an integer greater than or equal to 3.

9. The multi-phase clock generation circuit of claim 7, wherein the first NAND gate is a second two-input NAND gate, wherein the input clock signals are differential clock signals, wherein second clock signal input ends of first logic gates of every two adjacent stages in the first loop are configured to respectively receive two clock signals in the differential clock signals, wherein two first logic gates are spaced between the two second NAND gates, wherein a quantity of the first logic gates is 4, wherein a quantity of the first latches is 4, and wherein the multi-phase clock signals are 4-phase clocks signals.

10. The multi-phase clock generation circuit of claim 7, wherein the first NAND gate is a second two-input NAND gate, wherein the input clock signals are intermediate clock signals, wherein N first logic gates are spaced between the two second NAND gates, wherein a quantity of the first logic gates is 2N, wherein a quantity of the first latches is N, wherein the multi-phase clock signals are 2N-phase clock signals, wherein N is an even number greater than 1, and wherein the multi-phase clock generation circuit further comprises:
 a second loop;
 N second logic gates coupled in series in the second loop, wherein the N second logic gates are NOR gates or NAND gates, wherein each of the N second logic gates comprises:
  a second selection signal input end electrically coupled to a fifth output end of a second logic gate of a second previous stage;
  a second clock signal input end, wherein second clock signal input ends of the N second logic gates are configured to receive differential clock signals; and
  a sixth output end, wherein sixth output ends of the N second logic gates are configured to output N intermediate clock signals to clock signal input ends of the 2N first logic gates, and wherein two first logic gates at an interval of N−1 first logic gates receive intermediate clock signals output by a seventh output end of a same second logic gate; and N/2 second latches disposed in the second loop and configured to respectively latch a third signal received at a second selection signal input end of at least one second logic gate of the N second logic gates.

11. The multi-phase clock generation circuit of claim 10, wherein each of the N second logic gates is a first NOR gate, wherein each of the N/2 second latches is configured to latch fourth signals received at second selection signal input ends of two second logic gates in the at least one second logic gate and comprises two second NOR gates symmetrically disposed in the second loop, wherein the first NOR gate is a first two-input NOR gate, and wherein each of the two NOR gates is a second two-input NOR gate and comprises:

a third input end;
a fourth input end electrically coupled to an eighth output end of a remaining second NOR gate of the two second NOR gates; and
a ninth output end;
wherein the eighth output end and the ninth output end are further respectively electrically coupled to the second selection signal input ends, wherein fourth clock signal input ends of second logic gates of every two adjacent stages in the second loop are respectively configured to receive the differential clock signals, and wherein N/2 second logic gates are spaced between the two second NOR gates.

12. A radio frequency signal processing circuit comprising:
a local oscillator comprising a first output end; and
a frequency mixer comprising:
an input end electrically coupled to the first output end; and
a multi-phase clock generation circuit comprising:
a loop;
a plurality of logic gates coupled in series in the loop, wherein the logic gates are NOR gates or NAND gates, and wherein each of the logic gates comprises:
a selection signal input end electrically coupled to a second output end of a logic gate of a previous stage;
a clock signal input end configured to receive input clock signals; and
a third output end configured to output multi-phase clock signals; and
a plurality of latches disposed in the loop and configured to latch a signal received at a selection signal input end of at least one logic gate of the logic gates.

13. A wireless communication device:
an antenna configured to receive a first signal; and
a radio frequency signal processing circuit, coupled to the antenna, configured to process the signal, and comprising:
a local oscillator comprising a first output end; and
a frequency mixer comprising:
a first input end electrically coupled to the first output end; and
a multi-phase clock generation circuit comprising:
a first loop;
a plurality of first logic gates coupled in series in the first loop, wherein the first logic gates are NOR gates or NAND gates, and wherein each of the first logic gates comprises:
a first selection signal input end electrically coupled to a second output end of a first logic gate of a first previous stage;
a first clock signal input end configured to receive input clock signals; and
a third output end configured to output multi-phase clock signals; and
a plurality of first latches disposed in the first loop and configured to latch a second signal received at a first selection signal input end of at least one first logic gate of the first logic gates.

14. The wireless communication device of claim 13, wherein each of the first logic gates is a first NOR gate, wherein each of the first latches is configured to latch third signals received at first selection signal input ends of two first logic gates in the at least one first logic gate and comprises two second NOR gates symmetrically disposed in the first loop, and wherein each of the two second NOR gates is a first two-input NOR gate and comprises:

a second input end;
a third input end electrically coupled to a fourth output end of a remaining second NOR gate of the two second NOR gates; and
a fifth output end,
wherein the fourth output end and the fifth output end are further configured to respectively electrically couple to the first selection signal input ends.

15. The wireless communication device of claim 14, wherein the first NOR gate is a three-input NOR gate, wherein the input clock signals are differential clock signals, wherein each of the first logic gates further comprises a second selection signal input end electrically coupled to a first selection signal input end of a first logic gate of a previous (N−2) stage, wherein second clock signal input ends of first logic gates of every two adjacent stages in the first loop are configured to respectively receive two clock signals in the differential clock signals, wherein N first logic gates are spaced between the two second NOR gates, wherein a quantity of the first logic gates is 2N, wherein a quantity of the first latches is N, wherein the multi-phase clock signals are 2N-phase clock signals, and wherein N is an integer greater than or equal to 3.

16. The wireless communication device of claim 14, wherein the first NOR gate is a second two-input NOR gate, wherein the input clock signals are differential clock signals, wherein second clock signal input ends of first logic gates of every two adjacent stages in the first loop are configured to respectively receive two clock signals in the differential clock signals, wherein two first logic gates are spaced between the two second NOR gates, wherein a quantity of the first logic gates is 4, wherein a quantity of the first latches is 2, and wherein the multi-phase clock signals are 4-phase clocks signals.

17. The wireless communication device of claim 14, wherein the first NOR gate is a second two-input NOR gate, wherein the input clock signals are intermediate clock signals, wherein N first logic gates are spaced between the two second NOR gates, wherein a quantity of the first logic gates is 2N, wherein a quantity of the first latches is N, wherein the multi-phase clock signals are 2N-phase clock signals, wherein N is an even number greater than 1, and wherein the multi-phase clock generation circuit further comprises:
a second loop;

N second logic gates coupled in series in the second loop, wherein the N second logic gates are NOR gates or NAND gates, wherein each of the N second logic gates comprises:
- a second selection signal input end electrically coupled to a sixth output end of a second logic gate of a second previous stage;
- a second clock signal input end, wherein second clock signal input ends of the N second logic gates are configured to receive differential clock signals; and
- a seventh output end, wherein seventh output ends of the N second logic gates are configured to output N intermediate clock signals to third clock signal input ends of the 2N first logic gates, and wherein two first logic gates at an interval of N−1 first logic gates receive intermediate clock signals output by an eighth output end of a same second logic gate; and N/2 second latches disposed in the second loop and configured to respectively latch a fourth signal received at a second selection signal input end of at least one second logic gate of the N second logic gates.

18. The wireless communication device of claim 17, wherein each of the N second logic gates is a first NAND gate, wherein each of the N/2 second latches is configured to latch fifth signals received at second selection signal input ends of two second logic gates in the at least one second logic gate and comprises two second NAND gates symmetrically disposed in the second loop, wherein the first NAND gate is a first two-input NAND gate, and wherein each of the two second NAND gates is a second two-input NAND gate and comprises:
- a fourth input end;
- a fifth input end electrically coupled to a ninth output end of a remaining second NAND gate of the two second NAND gates; and
- a tenth output end,
- wherein the ninth output end and the tenth output end are further respectively electrically coupled to the second selection signal input ends, wherein fourth clock signal input ends of second logic gates of every two adjacent stages in the second loop are respectively configured to receive two clock signals in the differential clock signals, and wherein N/2 second logic gates are spaced between the two second NAND gates.

19. The wireless communication device of claim 13, wherein the multi-phase clock generation circuit further comprises a plurality of first phase inverters, wherein the third output end is configured to output the multi-phase clock signals through one first phase inverter in the first phase inverters, wherein each of the first logic gates is a first NAND gate, wherein each of the first latches is configured to latch third signals received at first selection signal input ends of two first logic gates in the at least one first logic gate and comprises two second NAND gates symmetrically disposed in the first loop, wherein each of the two second NAND gates is a first two-input NAND gate and comprises:
- a second input end;
- a third input end electrically coupled to a fourth output end of a remaining second NAND gate of the two second NAND gates; and
- a fifth output end,
- wherein the fourth output end and the fifth output end are further configured to respectively electrically couple to the first selection signal input ends.

20. The wireless communication device of claim 19, wherein the first NAND gate is a three-input NAND gate, wherein the input clock signals are differential clock signals, wherein each of the first logic gates further comprises a second selection signal input end electrically coupled to a first selection signal input end of a first logic gate of a previous (N−2) stage, wherein second clock signal input ends of every two adjacent levels of first logic gates in the first loop are configured to respectively receive two clock signals in the differential clock signals, wherein N first logic gates are spaced between the two second NAND gates, wherein a quantity of the first logic gates is 2N, wherein a quantity of the first latches is N, wherein the multi-phase clock signals are 2N-phase clock signals, and wherein N is an integer greater than or equal to 3.

* * * * *